United States Patent
Hendry et al.

(10) Patent No.: US 11,425,377 B2
(45) Date of Patent: Aug. 23, 2022

(54) ARBITRARY AND WRAP-AROUND TILE GROUPING

(71) Applicant: Huawei Technologies Co., Ltd., Shenzhen (CN)

(72) Inventors: Hendry, San Diego, CA (US); Ye-Kui Wang, San Diego, CA (US)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 17/345,870

(22) Filed: Jun. 11, 2021

(65) Prior Publication Data

US 2021/0321100 A1  Oct. 14, 2021

Related U.S. Application Data

(63) Continuation of application No. PCT/US2019/066350, filed on Dec. 13, 2019.

(60) Provisional application No. 62/780,053, filed on Dec. 14, 2018.

(51) Int. Cl.
| | |
|---|---|
| *H04N 19/119* | (2014.01) |
| *H04N 19/136* | (2014.01) |
| *H04N 19/172* | (2014.01) |
| *H04N 19/184* | (2014.01) |
| *H04N 19/70* | (2014.01) |

(52) U.S. Cl.
CPC ......... *H04N 19/119* (2014.11); *H04N 19/136* (2014.11); *H04N 19/172* (2014.11); *H04N 19/184* (2014.11); *H04N 19/70* (2014.11)

(58) Field of Classification Search
CPC ........................ H04N 19/119; H04N 19/136
See application file for complete search history.

(56) References Cited

U.S. PATENT DOCUMENTS

| | | | |
|---|---|---|---|
| 2013/0101035 | A1 | 4/2013 | Wang et al. |
| 2014/0301464 | A1 | 10/2014 | Wu et al. |
| 2015/0023407 | A1 | 1/2015 | Sato |
| 2017/0041021 | A1 | 2/2017 | Karkkainen et al. |
| 2017/0064330 | A1* | 3/2017 | Li .......................... H04N 19/90 |

(Continued)

FOREIGN PATENT DOCUMENTS

| | | |
|---|---|---|
| WO | 2017029400 A1 | 2/2017 |
| WO | 2018066985 A1 | 4/2018 |

OTHER PUBLICATIONS

Document: JVET-L1001-v5, "Versatile Video Coding (Draft 3)," Joint Video Experts Team (JVET) of ITU-T SG 16 WP 3 and ISO/IEC JTC 1/SC 29/WG 11, 12th Meeting: Macao, CN, Oct. 3-12, 2018, 193 pages.

(Continued)

*Primary Examiner* — Jerry T Jean Baptiste
(74) *Attorney, Agent, or Firm* — Conley Rose, P.C.

(57) ABSTRACT

A video coding mechanism is disclosed. The mechanism includes partitioning a first picture into a plurality of tiles. A group of the tiles is assigned into a first tile group. The first tile group is a rectangular shape that wraps around the first picture in a horizontal direction and a vertical direction. The first tile group is encoded into a bitstream. A flag is encoded into a parameter set in the bitstream to indicate the first tile group is an arbitrary tile group. The bitstream is stored for communication toward a decoder.

18 Claims, 11 Drawing Sheets

(56) References Cited

U.S. PATENT DOCUMENTS

2019/0104310 A1* 4/2019 Kim .................... H04N 19/463
2021/0250598 A1* 8/2021 Nishi ................... H04N 19/44

OTHER PUBLICATIONS

Document: JCTVC-AC1005-v2, "HEVC Additional Supplemental Enhancement Information (Draft 4)," Joint Collaborative Team on Video Coding (JCT-VC) of ITU-T SG 16 WP 3 and ISO/IEC JTC 1/SC 29/WG 11, 29th Meeting: Macao, CN, Oct. 19-25, 2017, 56 pages.
Document: JVET-K1001-v4, "Versatile Video Coding (Draft 2)," Joint Video Experts Team (JVET) of ITU-T SG 16 WP 3 and ISO/IEC JTC 1/SC 29/WG 11, 11th Meeting: Ljubljana, SI, Jul. 10-18, 2018, 86 pages.
Document: JVEI -K1002-v1, "Algorithm description for Versatile Video Coding and Test Model 2 (VTM 2)," Joint Video Experts Team (JVET) of ITU-T SG 16 WP 3 and ISO/IEC JTC 1/SC 29/WG 11, 11th Meeting: Ljubljana, SI, Jul. 10-18, 2018, 19 pages.
"Line Transmission of Non-Telephonesignals Video Codec for Audiovisual Services At p × 64 kbits," ITU-T Recommendation H.261, Mar. 1993, 29 pages.
"Transmission of Non-Telephone Signals; Information Technology—Generic Coding of Moving Pictures and Associated Audi Information: Video," ITU-T Recommendation H.262, Jul. 1995, 211 pages.
"Series H: Audiovisual and Multimedia Systems Infrastructure of audiovisual services—Coding of moving video Video coding for low bit rate communication," ITU-T Recommendation H.263, Jan. 2005, 226 pages.
"Series H: Audiovisual and Multimedia Systems Infrastructure of audiovisual services—Coding of moving video Advanced video coding for generic audiovisual services," Recommendation ITU-T H.264, Jun. 2019, 836 pages.
"Series H: Audiovisual and Multimedia Systems Infrastructure of audiovisual services Coding of moving video High efficiency video coding," Recommendation ITU-T H.265, Apr. 2013, 317 pages.

\* cited by examiner

ARBITRARY AND WRAP-AROUND TILE GROUPING

CROSS-REFERENCE TO RELATED APPLICATIONS

This patent application is a continuation of International Application No. PCT/US2019/066350, filed Dec. 13, 2019 by FNU Hendry, et. al., and titled "Arbitrary and Wrap-Around Tile Grouping," which claims the benefit of U.S. Provisional Patent Application No. 62/780,053, filed Dec. 14, 2018 by FNU Hendry, et. al., and titled "Arbitrary and Wrap-Around Tile Grouping," which are hereby incorporated by reference.

TECHNICAL FIELD

The present disclosure is generally related to video coding, and is specifically related to tile groups that wrap around picture boundaries to support increased compression in video coding.

BACKGROUND

The amount of video data needed to depict even a relatively short video can be substantial, which may result in difficulties when the data is to be streamed or otherwise communicated across a communications network with limited bandwidth capacity. Thus, video data is generally compressed before being communicated across modern day telecommunications networks. The size of a video could also be an issue when the video is stored on a storage device because memory resources may be limited. Video compression devices often use software and/or hardware at the source to code the video data prior to transmission or storage, thereby decreasing the quantity of data needed to represent digital video images. The compressed data is then received at the destination by a video decompression device that decodes the video data. With limited network resources and ever increasing demands of higher video quality, improved compression and decompression techniques that improve compression ratio with little to no sacrifice in image quality are desirable.

SUMMARY

In an embodiment, the disclosure includes a method implemented in an encoder, the method comprising: partitioning, by a processor of the encoder, a first picture into a plurality of tiles; assigning, by the processor, a group of the tiles into a first tile group, wherein the first tile group is a rectangular shape that wraps around the first picture in a horizontal direction and a vertical direction; encoding, by the processor, the first tile group into a bitstream; encoding, by the processor, a flag into a parameter set in the bitstream to indicate the first tile group is an arbitrary tile group; and storing, in a memory of the encoder, the bitstream for communication toward a decoder. Some systems employ tile groups that wrap around a picture in a horizontal or a vertical direction, but not both. Such systems may determine the number of tiles in the tile group by subtracting the index of the first tile of the tile group from the index of the last tile of the tile group. Wrapping around the picture in both directions is such systems may result in an improper determination of the number of tiles in the tile group. The present aspect provides a mechanism to correctly determine the proper number of tiles in the tile group no matter how the tile group wraps around the picture, including when wrapping in both directions.

Optionally, in any of the preceding aspects, another implementation of the aspect provides, wherein the flag is an arbitrary_tile_group_present_flag.

Optionally, in any of the preceding aspects, another implementation of the aspect provides, wherein the flag is encoded into a picture parameter set (PPS) associated with the first picture.

Optionally, in any of the preceding aspects, another implementation of the aspect provides, further comprising encoding, by the processor, a first tile index and a last tile index in a tile group header, wherein the first tile index indicates a first tile in the first tile group, and wherein the last tile index indicates a last tile in the first tile group.

Optionally, in any of the preceding aspects, another implementation of the aspect provides, further comprising determining a number of tiles in a second tile group partitioned from a second picture by: setting a delta tile index as a difference between a last tile index of the second tile group and a first tile index of the second tile group; determining a number of tile rows in the second tile group by dividing the delta tile index by a number of tile columns in the second picture plus one; and determining a number of tile columns in the second tile group as the delta tile index modulo the number of tile columns in the second picture plus one. This aspect describes an example mechanism for determining the number of columns and rows in a tile group based solely on the last tile index and the first tile index. This aspect addresses the case where no tile wrapping occurs.

Optionally, in any of the preceding aspects, another implementation of the aspect provides, wherein, prior to determining the number of tile rows in the second tile group and the number of tile columns in the second tile group, the delta tile index is increased by a number of tiles in the second picture and the number of tile columns in the second picture when the last tile index of the second tile group is less than the first tile index of the second tile group, indicating a vertical wrap, and a first tile column index is greater than a last tile column index, indicating a horizontal wrap. This aspect modifies the preceding aspects to allow for proper computation when there is both horizontal and vertical wrapping.

Optionally, in any of the preceding aspects, another implementation of the aspect provides, wherein, prior to determining the number of tile rows in the second tile group and the number of tile columns in the second tile group, the delta tile index is increased by a number of tiles in the second picture when the last tile index of the second tile group is less than the first tile index of the second tile group, indicating a vertical wrap, and a first tile column index is not greater than a last tile column index, indicating no horizontal wrap. This aspect modifies the preceding aspects to allow for proper computation when there is only vertical wrapping.

Optionally, in any of the preceding aspects, another implementation of the aspect provides, wherein, prior to determining the number of tile rows in the second tile group and the number of tile columns in the second tile group, the delta tile index is increased by the number of tile columns in the second picture when the last tile index of the second tile group is not less than the first tile index of the second tile group, indicating no vertical wrap, and a first tile column index is greater than a last tile column index, indicating a horizontal wrap. This aspect modifies the preceding aspects to allow for proper computation when there is only horizontal wrapping.

In an embodiment, the disclosure includes a method implemented in a decoder, the method comprising: receiving, by a processor of the decoder via a receiver, a bitstream including a parameter set and a first tile group containing a group of tiles partitioned from a first picture; obtaining, by the processor, a flag from the parameter set, wherein the flag indicates the first tile group is an arbitrary tile group; determining, by the processor, a number of tiles in the first tile group based on the flag, a first tile index, and a last tile index, wherein the first tile group is a rectangular shape that wraps around the first picture in a horizontal direction and a vertical direction; and decoding, by the processor, the first tile group to generate a reconstructed video sequence for display. Some systems employ tile groups that wrap around a picture in a horizontal or a vertical direction, but not both. Such systems may determine the number of tiles in the tile group by subtracting the index of the first tile of the tile group from the index of the last tile of the tile group. Wrapping around the picture in both directions is such systems may result in an improper determination of the number of tiles in the tile group. The present aspect provides a mechanism to correctly determine the proper number of tiles in the tile group no matter how the tile group wraps around the picture, including when wrapping in both directions.

Optionally, in any of the preceding aspects, another implementation of the aspect provides, wherein the flag is an arbitrary_tile_group_present_flag.

Optionally, in any of the preceding aspects, another implementation of the aspect provides, wherein the flag is obtained from a PPS associated with the first picture.

Optionally, in any of the preceding aspects, another implementation of the aspect provides, further comprising obtaining, by the processor, the first tile index and the last tile index from a tile group header, wherein the first tile index indicates a first tile in the first tile group, and wherein the last tile index indicates a last tile in the first tile group.

Optionally, in any of the preceding aspects, another implementation of the aspect provides, further comprising determining a number of tiles in a second tile group partitioned from a second picture by: setting a delta tile index as a difference between a last tile index of the second tile group and a first tile index of the second tile group; determining a number of tile rows in the second tile group by dividing the delta tile index by a number of tile columns in the second picture plus one; and determining a number of tile columns in the second tile group as the delta tile index modulo the number of tile columns in the second picture plus one. This aspect describes an example mechanism for determining the number of columns and rows in a tile group based solely on the last tile index and the first tile index. This aspect addresses the case where no tile wrapping occurs.

Optionally, in any of the preceding aspects, another implementation of the aspect provides, wherein, prior to determining the number of tile rows in the second tile group and the number of tile columns in the second tile group, the delta tile index is increased by a number of tiles in the second picture and the number of tile columns in the second picture when the last tile index of the second tile group is less than the first tile index of the second tile group, indicating a vertical wrap, and a first tile column index is greater than a last tile column index, indicating a horizontal wrap. This aspect modifies the preceding aspects to allow for proper computation when there is both horizontal and vertical wrapping.

Optionally, in any of the preceding aspects, another implementation of the aspect provides, wherein, prior to determining the number of tile rows in the second tile group and the number of tile columns in the second tile group, the delta tile index is increased by a number of tiles in the second picture when the last tile index of the second tile group is less than the first tile index, indicating a vertical wrap, and a first tile column index is not greater than a last tile column index, indicating no horizontal wrap. This aspect modifies the preceding aspects to allow for proper computation when there is only vertical wrapping.

Optionally, in any of the preceding aspects, another implementation of the aspect provides, wherein, prior to determining the number of tile rows in the second tile group and the number of tile columns in the second tile group, the delta tile index is increased by the number of tile columns in the second picture when the last tile index of the second tile group is not less than the first tile index, indicating no vertical wrap, and a first tile column index is greater than a last tile column index, indicating a horizontal wrap. This aspect modifies the preceding aspects to allow for proper computation when there is only horizontal wrapping.

In an embodiment, the disclosure includes a video coding device comprising: a processor, a receiver coupled to the processor, and a transmitter coupled to the processor, the processor, receiver, and transmitter configured to perform the method of any of the preceding aspects.

In an embodiment, the disclosure includes a non-transitory computer readable medium comprising a computer program product for use by a video coding device, the computer program product comprising computer executable instructions stored on the non-transitory computer readable medium such that when executed by a processor cause the video coding device to perform the method of any of the preceding aspects.

In an embodiment, the disclosure includes an encoder comprising: a partitioning means for partitioning a first picture into a plurality of tiles; an assigning means for assigning a group of the tiles into a first tile group, wherein the first tile group is a rectangular shape that wraps around the first picture in a horizontal direction and a vertical direction; an encoding means for: encoding the first tile group into a bitstream; and encoding a flag into a parameter set in the bitstream to indicate the first tile group is an arbitrary tile group; and a storage means for storing the bitstream for communication toward a decoder.

Optionally, in any of the preceding aspects, another implementation of the aspect provides, wherein the encoder is further configured to perform the method any of the preceding aspects.

In an embodiment, the disclosure includes a decoder comprising: a receiving means for receiving a bitstream including a first tile group containing a group of tiles partitioned from a first picture; an obtaining means for obtaining a flag from a parameter set in the bitstream, wherein the flag indicates the first tile group is an arbitrary tile group; a determining means for determining a number of tiles in the first tile group based on the flag, a first tile index, and a last tile index, wherein the first tile group is a rectangular shape that wraps around the first picture in a horizontal direction and a vertical direction; and a decoding means for decoding the first tile group to generate a reconstructed video sequence for display.

Optionally, in any of the preceding aspects, another implementation of the aspect provides, wherein the decoder is further configured to perform the method of any of the preceding aspects.

For the purpose of clarity, any one of the foregoing embodiments may be combined with any one or more of the other foregoing embodiments to create a new embodiment within the scope of the present disclosure.

These and other features will be more clearly understood from the following detailed description taken in conjunction with the accompanying drawings and claims.

BRIEF DESCRIPTION OF THE DRAWINGS

For a more complete understanding of this disclosure, reference is now made to the following brief description, taken in connection with the accompanying drawings and detailed description, wherein like reference numerals represent like parts.

DETAILED DESCRIPTION

Figure 1:
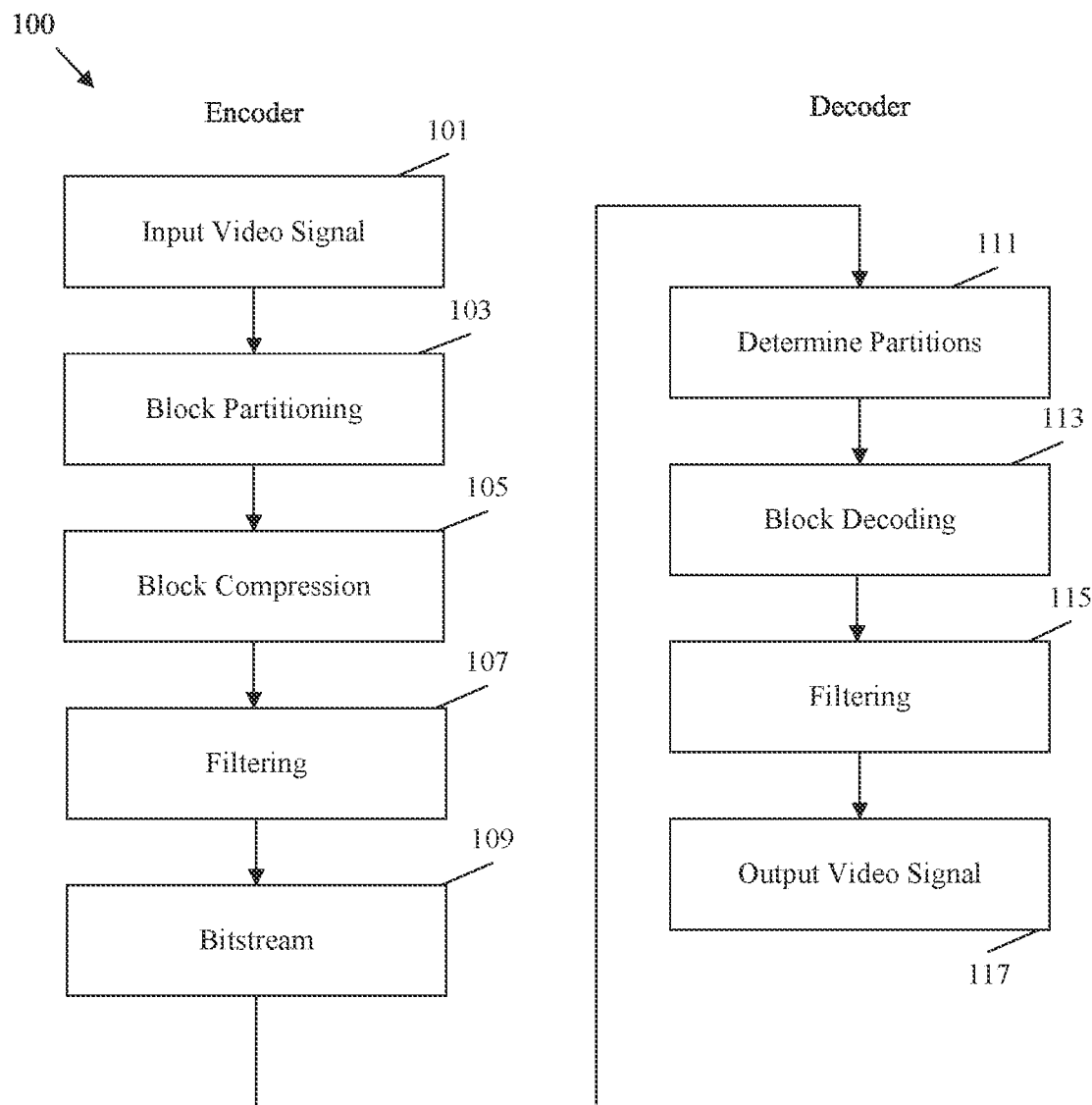
FIG. 1 is a flowchart of an example method of coding a video signal.

It should be understood at the outset that although an illustrative implementation of one or more embodiments are provided below, the disclosed systems and/or methods may be implemented using any number of techniques, whether currently known or in existence. The disclosure should in no way be limited to the illustrative implementations, drawings, and techniques illustrated below, including the exemplary designs and implementations illustrated and described herein, but may be modified within the scope of the appended claims along with their full scope of equivalents.

Various acronyms are employed herein, such as coding tree block (CTB), coding tree unit (CTU), coding unit (CU), coded video sequence (CVS), Joint Video Experts Team (JVET), motion constrained tile set (MCTS), maximum transfer unit (MTU), network abstraction layer (NAL), picture order count (POC), raw byte sequence payload (RBSP), sequence parameter set (SPS), versative video coding (VVC), and working draft (WD).

Many video compression techniques can be employed to reduce the size of video files with minimal loss of data. For example, video compression techniques can include performing spatial (e.g., intra-picture) prediction and/or temporal (e.g., inter-picture) prediction to reduce or remove data redundancy in video sequences. For block-based video coding, a video slice (e.g., a video picture or a portion of a video picture) may be partitioned into video blocks, which may also be referred to as treeblocks, coding tree blocks (CTBs), coding tree units (CTUs), coding units (CUs), and/or coding nodes. Video blocks in an intra-coded (I) slice of a picture are coded using spatial prediction with respect to reference samples in neighboring blocks in the same picture. Video blocks in an inter-coded unidirectional prediction (P) or bidirectional prediction (B) slice of a picture may be coded by employing spatial prediction with respect to reference samples in neighboring blocks in the same picture or temporal prediction with respect to reference samples in other reference pictures. Pictures may be referred to as frames and/or images, and reference pictures may be referred to as reference frames and/or reference images. Spatial or temporal prediction results in a predictive block representing an image block. Residual data represents pixel differences between the original image block and the predictive block. Accordingly, an inter-coded block is encoded according to a motion vector that points to a block of reference samples forming the predictive block and the residual data indicating the difference between the coded block and the predictive block. An intra-coded block is encoded according to an intra-coding mode and the residual data. For further compression, the residual data may be transformed from the pixel domain to a transform domain. These result in residual transform coefficients, which may be quantized. The quantized transform coefficients may initially be arranged in a two-dimensional array. The quantized transform coefficients may be scanned in order to produce a one-dimensional vector of transform coefficients. Entropy coding may be applied to achieve even more compression. Such video compression techniques are discussed in greater detail below.

To ensure an encoded video can be accurately decoded, video is encoded and decoded according to corresponding video coding standards. Video coding standards include International Telecommunication Union (ITU) Standardization Sector (ITU-T) H.261, International Organization for Standardization/International Electrotechnical Commission (ISO/IEC) Motion Picture Experts Group (MPEG)-1 Part 2, ITU-T H.262 or ISO/IEC MPEG-2 Part 2, ITU-T H.263, ISO/IEC MPEG-4 Part 2, Advanced Video Coding (AVC), also known as ITU-T H.264 or ISO/IEC MPEG-4 Part 10, and High Efficiency Video Coding (HEVC), also known as ITU-T H.265 or MPEG-H Part 2. AVC includes extensions such as Scalable Video Coding (SVC), Multiview Video Coding (MVC) and Multiview Video Coding plus Depth (MVC+D), and three dimensional (3D) AVC (3D-AVC). HEVC includes extensions such as Scalable HEVC (SHVC), Multiview HEVC (MV-HEVC), and 3D HEVC (3D-HEVC). The joint video experts team (JVET) of ITU-T and ISO/IEC has begun developing a video coding standard referred to as Versatile Video Coding (VVC). VVC is included in a Working Draft (WD), which includes JVET-L1001-v9.

In order to code a video image, the image is first partitioned, and the partitions are coded into a bitstream. Various picture partitioning schemes are available. For example, an image can be partitioned into regular slices, dependent slices, tiles, and/or according to Wavefront Parallel Processing (WPP). For simplicity, HEVC restricts encoders so that only regular slices, dependent slices, tiles, WPP, and combinations thereof can be used when partitioning a slice into groups of CTBs for video coding. Such partitioning can be applied to support Maximum Transfer Unit (MTU) size matching, parallel processing, and reduced end-to-end delay. MTU denotes the maximum amount of data that can be transmitted in a single packet. If a packet payload is in excess of the MTU, that payload is split into two packets through a process called fragmentation.

A regular slice, also referred to simply as a slice, is a partitioned portion of an image that can be reconstructed independently from other regular slices within the same picture, notwithstanding some interdependencies due to loop filtering operations. Each regular slice is encapsulated in its own Network Abstraction Layer (NAL) unit for transmission. Further, in-picture prediction (intra sample prediction, motion information prediction, coding mode prediction) and entropy coding dependency across slice boundaries may be disabled to support independent reconstruction. Such independent reconstruction supports parallelization. For example, regular slice based parallelization employs minimal inter-processor or inter-core communication. However, as each regular slice is independent, each slice is associated with a separate slice header. The use of regular slices can incur a substantial coding overhead due to the bit cost of the slice header for each slice and due to the lack of prediction across the slice boundaries. Further, regular slices may be employed to support matching for MTU size requirements. Specifically, as a regular slice is encapsulated in a separate NAL unit and can be independently coded, each regular slice should be smaller than the MTU in MTU schemes to avoid breaking the slice into multiple packets. As such, the goal of parallelization and the goal of MTU size matching may place contradicting demands to a slice layout in a picture.

Dependent slices are similar to regular slices, but have shortened slice headers and allow partitioning of the image treeblock boundaries without breaking in-picture prediction. Accordingly, dependent slices allow a regular slice to be fragmented into multiple NAL units, which provides reduced end-to-end delay by allowing a part of a regular slice to be sent out before the encoding of the entire regular slice is complete.

A tile is a partitioned portion of an image created by horizontal and vertical boundaries that create columns and rows of tiles. Tiles may be coded in raster scan order (right to left and top to bottom). The scan order of CTBs is local within a tile. Accordingly, CTBs in a first tile are coded in raster scan order, before proceeding to the CTBs in the next tile. Similar to regular slices, tiles break in-picture prediction dependencies as well as entropy decoding dependencies. However, tiles may not be included into individual NAL units, and hence tiles may not be used for MTU size matching. Each tile can be processed by one processor/core, and the inter-processor/inter-core communication employed for in-picture prediction between processing units decoding neighboring tiles may be limited to conveying a shared slice header (when adjacent tiles are in the same slice), and performing loop filtering related sharing of reconstructed samples and metadata. When more than one tile is included in a slice, the entry point byte offset for each tile other than the first entry point offset in the slice may be signaled in the slice header. For each slice and tile, at least one of the following conditions should be fulfilled: 1) all coded treeblocks in a slice belong to the same tile; and 2) all coded treeblocks in a tile belong to the same slice.

In WPP, the image is partitioned into single rows of CTBs. Entropy decoding and prediction mechanisms may use data from CTBs in other rows. Parallel processing is made possible through parallel decoding of CTB rows. For example, a current row may be decoded in parallel with a preceding row. However, decoding of the current row is delayed from the decoding process of the preceding rows by two CTBs. This delay ensures that data related to the CTB above and the CTB above and to the right of the current CTB in the current row is available before the current CTB is coded. This approach appears as a wavefront when represented graphically. This staggered start allows for parallelization with up to as many processors/cores as the image contains CTB rows. Because in-picture prediction between neighboring treeblock rows within a picture is permitted, the inter-processor/inter-core communication to enable in-picture prediction can be substantial. The WPP partitioning does consider NAL unit sizes. Hence, WPP does not support MTU size matching. However, regular slices can be used in conjunction with WPP, with certain coding overhead, to implement MTU size matching as desired.

Tiles may also include motion constrained tile sets. A motion constrained tile set (MCTS) is a tile set designed such that associated motion vectors are restricted to point to full-sample locations inside the MCTS and to fractional-sample locations that require only full-sample locations inside the MCTS for interpolation. Further, the usage of motion vector candidates for temporal motion vector prediction derived from blocks outside the MCTS is disallowed. This way, each MCTS may be independently decoded without the existence of tiles not included in the MCTS. Temporal MCTSs supplemental enhancement information (SEI) messages may be used to indicate the existence of MCTSs in the bitstream and signal the MCTSs. The MCTSs SEI message provides supplemental information that can be used in the MCTS sub-bitstream extraction (specified as part of the semantics of the SEI message) to generate a conforming bitstream for a MCTS. The information includes a number of extraction information sets, each defining a number of MCTSs and containing raw bytes sequence payload (RBSP) bytes of the replacement video parameter sets (VPSs), sequence parameter sets (SPSs), and picture parameter sets (PPSs) to be used during the MCTS sub-bitstream extraction process. When extracting a sub-bitstream according to the MCTS sub-bitstream extraction process, parameter sets (VPSs, SPSs, and PPSs) may be rewritten or replaced, and slice headers may updated because one or all of the slice address related syntax elements (including first_slice_segment_in_pic_flag and slice_segment_address) may employ different values in the extracted sub-bitstream.

The various tiling schemes may be employed when partitioning a picture for further encoding. As a particular example, tiles can be assigned to tile groups, which can take the place of slices in some examples. In some examples, each tile group can be extracted independently of other tile groups. Accordingly, tile grouping may support parallelization by allowing each tile group to be assigned to a different processor. Tile grouping can also be employed in use cases where a decoder may not wish to decode an entire image. As a particular example, video coding schemes may be employed to support virtual reality (VR) video.

In VR video, one or more cameras may record the environment around the camera(s). A user can then view the VR video as if the user were present in the same location as the camera. In VR video, a picture encompasses an entire environment around the user. The user then views a sub-portion of the picture. For example, a user may employ a head mounted display that changes the sub-portion of the picture displayed based on the head movements of the user. The portion of the video being displayed may be referred to as a viewport.

Tile grouping can be employed to support more efficient video coding for VR video. For example, the VR video can be partitioned into tile groups and encoded at a plurality of resolutions. The decoder can indicate the viewport currently used by the user during streaming. The video server providing the VR video data can then forward the tile group(s)

associated with the viewport at high resolution and forward non-viewed tile groups at lower resolution. This allows the user to view the VR video at a high resolution without requiring the entire picture be sent at high resolution. The non-viewed sub-portions are discarded, and hence the user may be unaware of the lower resolutions. However, the lower resolution tile groups may be displayed to the user if the user changes viewports. The resolution of the new viewport may then be increased as the video proceeds.

Tile groups may partition a picture into rectangles. The tiles contained in the tile group may be signaled by indicating the first tile and last tile of the tile group. In such a case, a tile index of the first tile may be a smaller value than the tile index of the last tile. The configuration of the tile group can be calculated at the decoder by comparing these values. This approach efficiently signals tile group information. However, an encoder may determine to wrap a tile group across picture boundaries in some cases. A tile group wraps around a picture in a vertical direction when the top row of the tile group is toward the bottom of the picture and the bottom row of the tile group is toward the top of the picture. A tile group wraps around a picture in a horizontal direction when the left column of the tile group is toward the right side of the picture and the right column of the tile group is toward left side of the picture. Stated formally, a horizontal wrap occurs when the left and right picture boundaries bisect a tile group, and a vertical wrap occurs when the top and bottom picture boundaries bisect a tile group. Such tile wrapping is particularly likely to occur in VR video. This is because VR pictures may contain an entire spherical environment flattened into a rectangular picture for encoding. As such, picture boundaries in a VR picture may be somewhat arbitrary, and tile group wrapping across such arbitrary picture boundaries may result in increased compression in some cases. Such wrapping tile groups may have a first tile with a tile index that is larger than the tile index of the last tile, which can cause the decoder to incorrectly compute the configuration of the tile group.

Disclosed herein are various mechanisms to support accurately signaling tile groups when such tile groups wrap across picture boundaries in the horizontal direction, in the vertical direction, and/or both. The encoder can encode an arbitrary_tile_group_present_flag into a parameter set, such as a picture parameter set (PPS), to indicate such a tile grouping is present in a picture. The encoder can also encode the first tile index and last tile index for the tile group, for example in a tile group header. The decoder can determine a delta tile index, which is a difference between the last tile index and the first tile index. The decoder can determine the nature of the tile group wrap, if any, and adjust the delta tile index accordingly. If the last tile index of the tile group is less than the first tile index of the tile group, the tile group includes a vertical wrap. If the first tile column index is greater than a last tile column index, the tile group a includes a horizontal wrap. If the tile group includes both a vertical and horizontal wrap, the delta tile index is increased by a number of tiles in the picture and the number of tile columns in the picture. If the tile group includes a vertical wrap and no horizontal wrap, the delta tile index is increased by a number of tiles in the picture. If the tile group includes no vertical wrap and a horizontal wrap, the delta tile index is increased by the number of tile columns in the picture. The decoder can then employ the delta tile index to determine the number of tile rows and tile columns in the tile group. For example, the number of tile rows in the tile group may be determined as the delta tile index divided by the number of tile columns in the picture plus one. Further, the number of tile columns in the tile group may be determined as the delta tile index modulo the number of tile columns in the picture plus one.

FIG. 1 is a flowchart of an example operating method 100 of coding a video signal. Specifically, a video signal is encoded at an encoder. The encoding process compresses the video signal by employing various mechanisms to reduce the video file size. A smaller file size allows the compressed video file to be transmitted toward a user, while reducing associated bandwidth overhead. The decoder then decodes the compressed video file to reconstruct the original video signal for display to an end user. The decoding process generally mirrors the encoding process to allow the decoder to consistently reconstruct the video signal.

At step 101, the video signal is input into the encoder. For example, the video signal may be an uncompressed video file stored in memory. As another example, the video file may be captured by a video capture device, such as a video camera, and encoded to support live streaming of the video. The video file may include both an audio component and a video component. The video component contains a series of image frames that, when viewed in a sequence, gives the visual impression of motion. The frames contain pixels that are expressed in terms of light, referred to herein as luma components (or luma samples), and color, which is referred to as chroma components (or color samples). In some examples, the frames may also contain depth values to support three dimensional viewing.

At step 103, the video is partitioned into blocks. Partitioning includes subdividing the pixels in each frame into square and/or rectangular blocks for compression. For example, in High Efficiency Video Coding (HEVC) (also known as H.265 and MPEG-H Part 2) the frame can first be divided into coding tree units (CTUs), which are blocks of a predefined size (e.g., sixty-four pixels by sixty-four pixels). The CTUs contain both luma and chroma samples. Coding trees may be employed to divide the CTUs into blocks and then recursively subdivide the blocks until configurations are achieved that support further encoding. For example, luma components of a frame may be subdivided until the individual blocks contain relatively homogenous lighting values. Further, chroma components of a frame may be subdivided until the individual blocks contain relatively homogenous color values. Accordingly, partitioning mechanisms vary depending on the content of the video frames.

At step 105, various compression mechanisms are employed to compress the image blocks partitioned at step 103. For example, inter-prediction and/or intra-prediction may be employed. Inter-prediction is designed to take advantage of the fact that objects in a common scene tend to appear in successive frames. Accordingly, a block depicting an object in a reference frame need not be repeatedly described in adjacent frames. Specifically, an object, such as a table, may remain in a constant position over multiple frames. Hence the table is described once and adjacent frames can refer back to the reference frame. Pattern matching mechanisms may be employed to match objects over multiple frames. Further, moving objects may be represented across multiple frames, for example due to object movement or camera movement. As a particular example, a video may show an automobile that moves across the screen over multiple frames. Motion vectors can be employed to describe such movement. A motion vector is a two-dimensional vector that provides an offset from the coordinates of an object in a frame to the coordinates of the object in a reference frame. As such, inter-prediction can encode an image block in a current frame as a set of motion vectors indicating an offset from a corresponding block in a reference frame.

Intra-prediction encodes blocks in a common frame. Intra-prediction takes advantage of the fact that luma and chroma components tend to cluster in a frame. For example, a patch of green in a portion of a tree tends to be positioned adjacent to similar patches of green. Intra-prediction employs multiple directional prediction modes (e.g., thirty-three in HEVC), a planar mode, and a direct current (DC) mode. The directional modes indicate that a current block is similar/the same as samples of a neighbor block in a corresponding direction. Planar mode indicates that a series of blocks along a row/column (e.g., a plane) can be interpolated based on neighbor blocks at the edges of the row. Planar mode, in effect, indicates a smooth transition of light/color across a row/column by employing a relatively constant slope in changing values. DC mode is employed for boundary smoothing and indicates that a block is similar/the same as an average value associated with samples of all the neighbor blocks associated with the angular directions of the directional prediction modes. Accordingly, intra-prediction blocks can represent image blocks as various relational prediction mode values instead of the actual values. Further, inter-prediction blocks can represent image blocks as motion vector values instead of the actual values. In either case, the prediction blocks may not exactly represent the image blocks in some cases. Any differences are stored in residual blocks. Transforms may be applied to the residual blocks to further compress the file.

At step 107, various filtering techniques may be applied. In HEVC, the filters are applied according to an in-loop filtering scheme. The block based prediction discussed above may result in the creation of blocky images at the decoder. Further, the block based prediction scheme may encode a block and then reconstruct the encoded block for later use as a reference block. The in-loop filtering scheme iteratively applies noise suppression filters, de-blocking filters, adaptive loop filters, and sample adaptive offset (SAO) filters to the blocks/frames. These filters mitigate such blocking artifacts so that the encoded file can be accurately reconstructed. Further, these filters mitigate artifacts in the reconstructed reference blocks so that artifacts are less likely to create additional artifacts in subsequent blocks that are encoded based on the reconstructed reference blocks.

Once the video signal has been partitioned, compressed, and filtered, the resulting data is encoded in a bitstream at step 109. The bitstream includes the data discussed above as well as any signaling data desired to support proper video signal reconstruction at the decoder. For example, such data may include partition data, prediction data, residual blocks, and various flags providing coding instructions to the decoder. The bitstream may be stored in memory for transmission toward a decoder upon request. The bitstream may also be broadcast and/or multicast toward a plurality of decoders. The creation of the bitstream is an iterative process. Accordingly, steps 101, 103, 105, 107, and 109 may occur continuously and/or simultaneously over many frames and blocks. The order shown in FIG. 1 is presented for clarity and ease of discussion, and is not intended to limit the video coding process to a particular order.

The decoder receives the bitstream and begins the decoding process at step 111. Specifically, the decoder employs an entropy decoding scheme to convert the bitstream into corresponding syntax and video data. The decoder employs the syntax data from the bitstream to determine the partitions for the frames at step 111. The partitioning should match the results of block partitioning at step 103. Entropy encoding/decoding as employed in step 111 is now described. The encoder makes many choices during the compression process, such as selecting block partitioning schemes from several possible choices based on the spatial positioning of values in the input image(s). Signaling the exact choices may employ a large number of bins. As used herein, a bin is a binary value that is treated as a variable (e.g., a bit value that may vary depending on context). Entropy coding allows the encoder to discard any options that are clearly not viable for a particular case, leaving a set of allowable options. Each allowable option is then assigned a code word. The length of the code words is based on the number of allowable options (e.g., one bin for two options, two bins for three to four options, etc.) The encoder then encodes the code word for the selected option. This scheme reduces the size of the code words as the code words are as big as desired to uniquely indicate a selection from a small sub-set of allowable options as opposed to uniquely indicating the selection from a potentially large set of all possible options. The decoder then decodes the selection by determining the set of allowable options in a similar manner to the encoder. By determining the set of allowable options, the decoder can read the code word and determine the selection made by the encoder.

At step 113, the decoder performs block decoding. Specifically, the decoder employs reverse transforms to generate residual blocks. Then the decoder employs the residual blocks and corresponding prediction blocks to reconstruct the image blocks according to the partitioning. The prediction blocks may include both intra-prediction blocks and inter-prediction blocks as generated at the encoder at step 105. The reconstructed image blocks are then positioned into frames of a reconstructed video signal according to the partitioning data determined at step 111. Syntax for step 113 may also be signaled in the bitstream via entropy coding as discussed above.

At step 115, filtering is performed on the frames of the reconstructed video signal in a manner similar to step 107 at the encoder. For example, noise suppression filters, deblocking filters, adaptive loop filters, and SAO filters may be applied to the frames to remove blocking artifacts. Once the frames are filtered, the video signal can be output to a display at step 117 for viewing by an end user.

Figure 2:
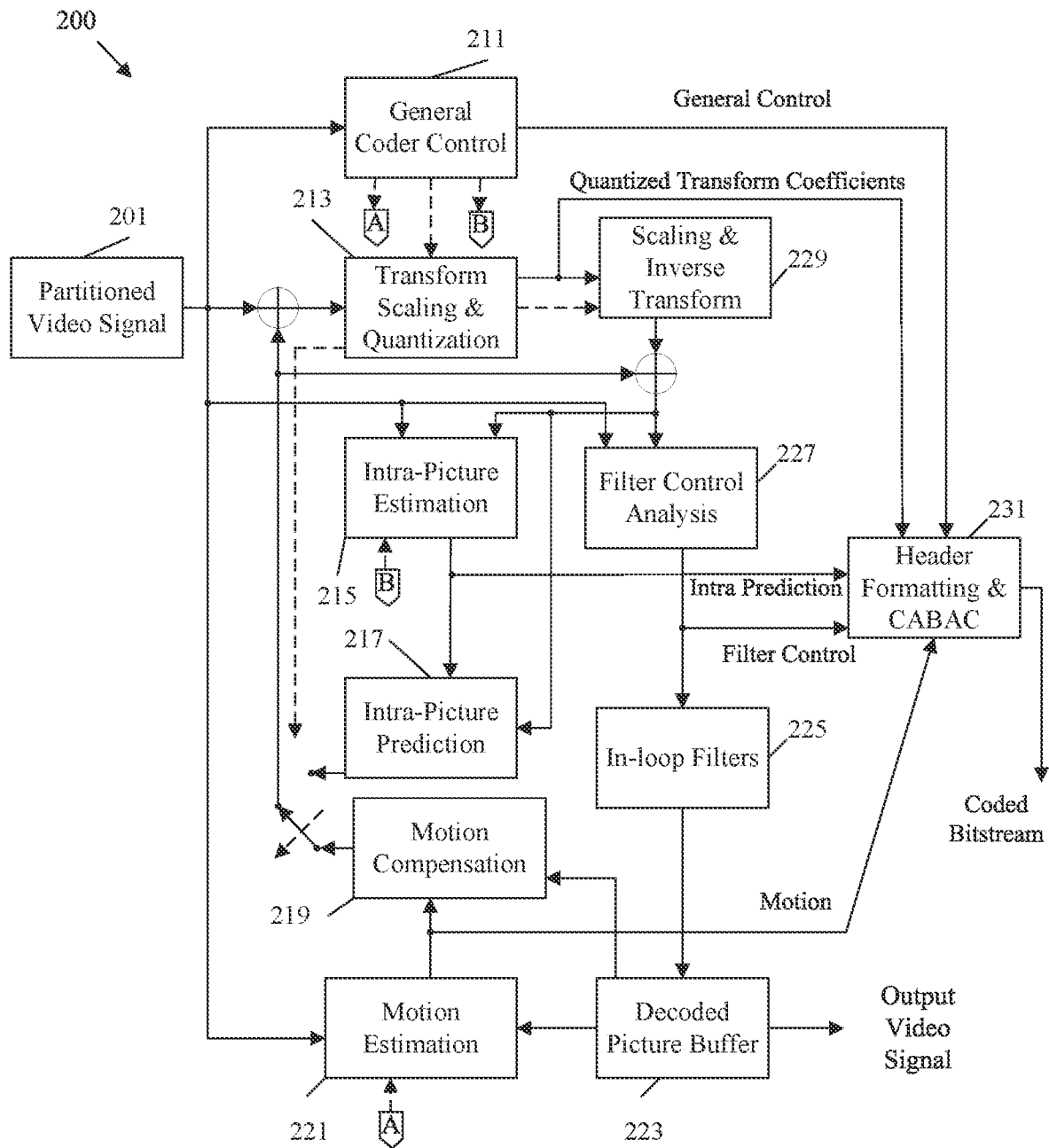
FIG. 2 is a schematic diagram of an example coding and decoding (codec) system for video coding.

FIG. 2 is a schematic diagram of an example coding and decoding (codec) system 200 for video coding. Specifically, codec system 200 provides functionality to support the implementation of operating method 100. Codec system 200 is generalized to depict components employed in both an encoder and a decoder. Codec system 200 receives and partitions a video signal as discussed with respect to steps 101 and 103 in operating method 100, which results in a partitioned video signal 201. Codec system 200 then compresses the partitioned video signal 201 into a coded bitstream when acting as an encoder as discussed with respect to steps 105, 107, and 109 in method 100. When acting as a decoder codec system 200 generates an output video signal from the bitstream as discussed with respect to steps 111, 113, 115, and 117 in operating method 100. The codec system 200 includes a general coder control component 211, a transform scaling and quantization component 213, an intra-picture estimation component 215, an intra-picture prediction component 217, a motion compensation component 219, a motion estimation component 221, a scaling and inverse transform component 229, a filter control analysis component 227, an in-loop filters component 225, a decoded picture buffer component 223, and a header formatting and context adaptive binary arithmetic coding (CABAC) component 231. Such components are coupled as shown. In FIG. 2, black lines indicate movement of data to be encoded/decoded while dashed lines indicate movement of control data that controls the operation of other components. The components of codec system 200 may all be present in the encoder. The decoder may include a subset of the components of codec system 200. For example, the decoder may include the intra-picture prediction component 217, the motion compensation component 219, the scaling and inverse transform component 229, the in-loop filters component 225, and the decoded picture buffer component 223. These components are now described.

The partitioned video signal 201 is a captured video sequence that has been partitioned into blocks of pixels by a coding tree. A coding tree employs various split modes to subdivide a block of pixels into smaller blocks of pixels. These blocks can then be further subdivided into smaller blocks. The blocks may be referred to as nodes on the coding tree. Larger parent nodes are split into smaller child nodes. The number of times a node is subdivided is referred to as the depth of the node/coding tree. The divided blocks can be included in coding units (CUs) in some cases. For example, a CU can be a sub-portion of a CTU that contains a luma block, red difference chroma (Cr) block(s), and a blue difference chroma (Cb) block(s) along with corresponding syntax instructions for the CU. The split modes may include a binary tree (BT), triple tree (TT), and a quad tree (QT) employed to partition a node into two, three, or four child nodes, respectively, of varying shapes depending on the split modes employed. The partitioned video signal 201 is forwarded to the general coder control component 211, the transform scaling and quantization component 213, the intra-picture estimation component 215, the filter control analysis component 227, and the motion estimation component 221 for compression.

The general coder control component 211 is configured to make decisions related to coding of the images of the video sequence into the bitstream according to application constraints. For example, the general coder control component 211 manages optimization of bitrate/bitstream size versus reconstruction quality. Such decisions may be made based on storage space/bandwidth availability and image resolution requests. The general coder control component 211 also manages buffer utilization in light of transmission speed to mitigate buffer underrun and overrun issues. To manage these issues, the general coder control component 211 manages partitioning, prediction, and filtering by the other components. For example, the general coder control component 211 may dynamically increase compression complexity to increase resolution and increase bandwidth usage or decrease compression complexity to decrease resolution and bandwidth usage. Hence, the general coder control component 211 controls the other components of codec system 200 to balance video signal reconstruction quality with bit rate concerns. The general coder control component 211 creates control data, which controls the operation of the other components. The control data is also forwarded to the header formatting and CABAC component 231 to be encoded in the bitstream to signal parameters for decoding at the decoder.

The partitioned video signal 201 is also sent to the motion estimation component 221 and the motion compensation component 219 for inter-prediction. A frame or slice of the partitioned video signal 201 may be divided into multiple video blocks. Motion estimation component 221 and the motion compensation component 219 perform inter-predictive coding of the received video block relative to one or more blocks in one or more reference frames to provide temporal prediction. Codec system 200 may perform multiple coding passes, e.g., to select an appropriate coding mode for each block of video data.

Motion estimation component 221 and motion compensation component 219 may be highly integrated, but are illustrated separately for conceptual purposes. Motion estimation, performed by motion estimation component 221, is the process of generating motion vectors, which estimate motion for video blocks. A motion vector, for example, may indicate the displacement of a coded object relative to a predictive block. A predictive block is a block that is found to closely match the block to be coded, in terms of pixel difference. A predictive block may also be referred to as a reference block. Such pixel difference may be determined by sum of absolute difference (SAD), sum of square difference (SSD), or other difference metrics. HEVC employs several coded objects including a CTU, coding tree blocks (CTBs), and CUs. For example, a CTU can be divided into CTBs, which can then be divided into CBs for inclusion in CUs. A CU can be encoded as a prediction unit (PU) containing prediction data and/or a transform unit (TU) containing transformed residual data for the CU. The motion estimation component 221 generates motion vectors, PUs, and TUs by using a rate-distortion analysis as part of a rate distortion optimization process. For example, the motion estimation component 221 may determine multiple reference blocks, multiple motion vectors, etc. for a current block/frame, and may select the reference blocks, motion vectors, etc. having the best rate-distortion characteristics. The best rate-distortion characteristics balance both quality of video reconstruction (e.g., amount of data loss by compression) with coding efficiency (e.g., size of the final encoding).

In some examples, codec system 200 may calculate values for sub-integer pixel positions of reference pictures stored in decoded picture buffer component 223. For example, video codec system 200 may interpolate values of one-quarter pixel positions, one-eighth pixel positions, or other fractional pixel positions of the reference picture. Therefore, motion estimation component 221 may perform a motion search relative to the full pixel positions and fractional pixel positions and output a motion vector with fractional pixel precision. The motion estimation component 221 calculates a motion vector for a PU of a video block in an inter-coded slice by comparing the position of the PU to the position of a predictive block of a reference picture. Motion estimation component 221 outputs the calculated motion vector as motion data to header formatting and CABAC component 231 for encoding and motion to the motion compensation component 219.

Motion compensation, performed by motion compensation component 219, may involve fetching or generating the predictive block based on the motion vector determined by motion estimation component 221. Again, motion estimation component 221 and motion compensation component 219 may be functionally integrated, in some examples. Upon receiving the motion vector for the PU of the current video block, motion compensation component 219 may locate the predictive block to which the motion vector points. A residual video block is then formed by subtracting pixel values of the predictive block from the pixel values of the current video block being coded, forming pixel difference values. In general, motion estimation component 221 performs motion estimation relative to luma components, and motion compensation component 219 uses motion vectors calculated based on the luma components for both chroma components and luma components. The predictive block and residual block are forwarded to transform scaling and quantization component 213.

The partitioned video signal 201 is also sent to intra-picture estimation component 215 and intra-picture prediction component 217. As with motion estimation component 221 and motion compensation component 219, intra-picture estimation component 215 and intra-picture prediction component 217 may be highly integrated, but are illustrated separately for conceptual purposes. The intra-picture estimation component 215 and intra-picture prediction component 217 intra-predict a current block relative to blocks in a current frame, as an alternative to the inter-prediction performed by motion estimation component 221 and motion compensation component 219 between frames, as described above. In particular, the intra-picture estimation component 215 determines an intra-prediction mode to use to encode a current block. In some examples, intra-picture estimation component 215 selects an appropriate intra-prediction mode to encode a current block from multiple tested intra-prediction modes. The selected intra-prediction modes are then forwarded to the header formatting and CABAC component 231 for encoding.

For example, the intra-picture estimation component 215 calculates rate-distortion values using a rate-distortion analysis for the various tested intra-prediction modes, and selects the intra-prediction mode having the best rate-distortion characteristics among the tested modes. Rate-distortion analysis generally determines an amount of distortion (or error) between an encoded block and an original unencoded block that was encoded to produce the encoded block, as well as a bitrate (e.g., a number of bits) used to produce the encoded block. The intra-picture estimation component 215 calculates ratios from the distortions and rates for the various encoded blocks to determine which intra-prediction mode exhibits the best rate-distortion value for the block. In addition, intra-picture estimation component 215 may be configured to code depth blocks of a depth map using a depth modeling mode (DMM) based on rate-distortion optimization (RDO).

The intra-picture prediction component 217 may generate a residual block from the predictive block based on the selected intra-prediction modes determined by intra-picture estimation component 215 when implemented on an encoder or read the residual block from the bitstream when implemented on a decoder. The residual block includes the difference in values between the predictive block and the original block, represented as a matrix. The residual block is then forwarded to the transform scaling and quantization component 213. The intra-picture estimation component 215 and the intra-picture prediction component 217 may operate on both luma and chroma components.

The transform scaling and quantization component 213 is configured to further compress the residual block. The transform scaling and quantization component 213 applies a transform, such as a discrete cosine transform (DCT), a discrete sine transform (DST), or a conceptually similar transform, to the residual block, producing a video block comprising residual transform coefficient values. Wavelet transforms, integer transforms, sub-band transforms or other types of transforms could also be used. The transform may convert the residual information from a pixel value domain to a transform domain, such as a frequency domain. The transform scaling and quantization component 213 is also configured to scale the transformed residual information, for example based on frequency. Such scaling involves applying a scale factor to the residual information so that different frequency information is quantized at different granularities, which may affect final visual quality of the reconstructed video. The transform scaling and quantization component 213 is also configured to quantize the transform coefficients to further reduce bit rate. The quantization process may reduce the bit depth associated with some or all of the coefficients. The degree of quantization may be modified by adjusting a quantization parameter. In some examples, the transform scaling and quantization component 213 may then perform a scan of the matrix including the quantized transform coefficients. The quantized transform coefficients are forwarded to the header formatting and CABAC component 231 to be encoded in the bitstream.

The scaling and inverse transform component 229 applies a reverse operation of the transform scaling and quantization component 213 to support motion estimation. The scaling and inverse transform component 229 applies inverse scaling, transformation, and/or quantization to reconstruct the residual block in the pixel domain, e.g., for later use as a reference block which may become a predictive block for another current block. The motion estimation component 221 and/or motion compensation component 219 may calculate a reference block by adding the residual block back to a corresponding predictive block for use in motion estimation of a later block/frame. Filters are applied to the reconstructed reference blocks to mitigate artifacts created during scaling, quantization, and transform. Such artifacts could otherwise cause inaccurate prediction (and create additional artifacts) when subsequent blocks are predicted.

The filter control analysis component 227 and the in-loop filters component 225 apply the filters to the residual blocks and/or to reconstructed image blocks. For example, the transformed residual block from the scaling and inverse transform component 229 may be combined with a corresponding prediction block from intra-picture prediction component 217 and/or motion compensation component 219 to reconstruct the original image block. The filters may then be applied to the reconstructed image block. In some examples, the filters may instead be applied to the residual blocks. As with other components in FIG. 2, the filter control analysis component 227 and the in-loop filters component 225 are highly integrated and may be implemented together, but are depicted separately for conceptual purposes. Filters applied to the reconstructed reference blocks are applied to particular spatial regions and include multiple parameters to adjust how such filters are applied. The filter control analysis component 227 analyzes the reconstructed reference blocks to determine where such filters should be applied and sets corresponding parameters. Such data is forwarded to the header formatting and CABAC component 231 as filter control data for encoding. The in-loop filters component 225 applies such filters based on the filter control data. The filters may include a deblocking filter, a noise suppression filter, a SAO filter, and an adaptive loop filter. Such filters may be applied in the spatial/pixel domain (e.g., on a reconstructed pixel block) or in the frequency domain, depending on the example.

When operating as an encoder, the filtered reconstructed image block, residual block, and/or prediction block are stored in the decoded picture buffer component 223 for later use in motion estimation as discussed above. When operating as a decoder, the decoded picture buffer component 223 stores and forwards the reconstructed and filtered blocks toward a display as part of an output video signal. The decoded picture buffer component 223 may be any memory device capable of storing prediction blocks, residual blocks, and/or reconstructed image blocks.

The header formatting and CABAC component 231 receives the data from the various components of codec system 200 and encodes such data into a coded bitstream for transmission toward a decoder. Specifically, the header formatting and CABAC component 231 generates various headers to encode control data, such as general control data and filter control data. Further, prediction data, including intra-prediction and motion data, as well as residual data in the form of quantized transform coefficient data are all encoded in the bitstream. The final bitstream includes all information desired by the decoder to reconstruct the original partitioned video signal 201. Such information may also include intra-prediction mode index tables (also referred to as codeword mapping tables), definitions of encoding contexts for various blocks, indications of most probable intra-prediction modes, an indication of partition information, etc. Such data may be encoded by employing entropy coding. For example, the information may be encoded by employing context adaptive variable length coding (CAVLC), CABAC, syntax-based context-adaptive binary arithmetic coding (SBAC), probability interval partitioning entropy (PIPE) coding, or another entropy coding technique. Following the entropy coding, the coded bitstream may be transmitted to another device (e.g., a video decoder) or archived for later transmission or retrieval.

Figure 3:
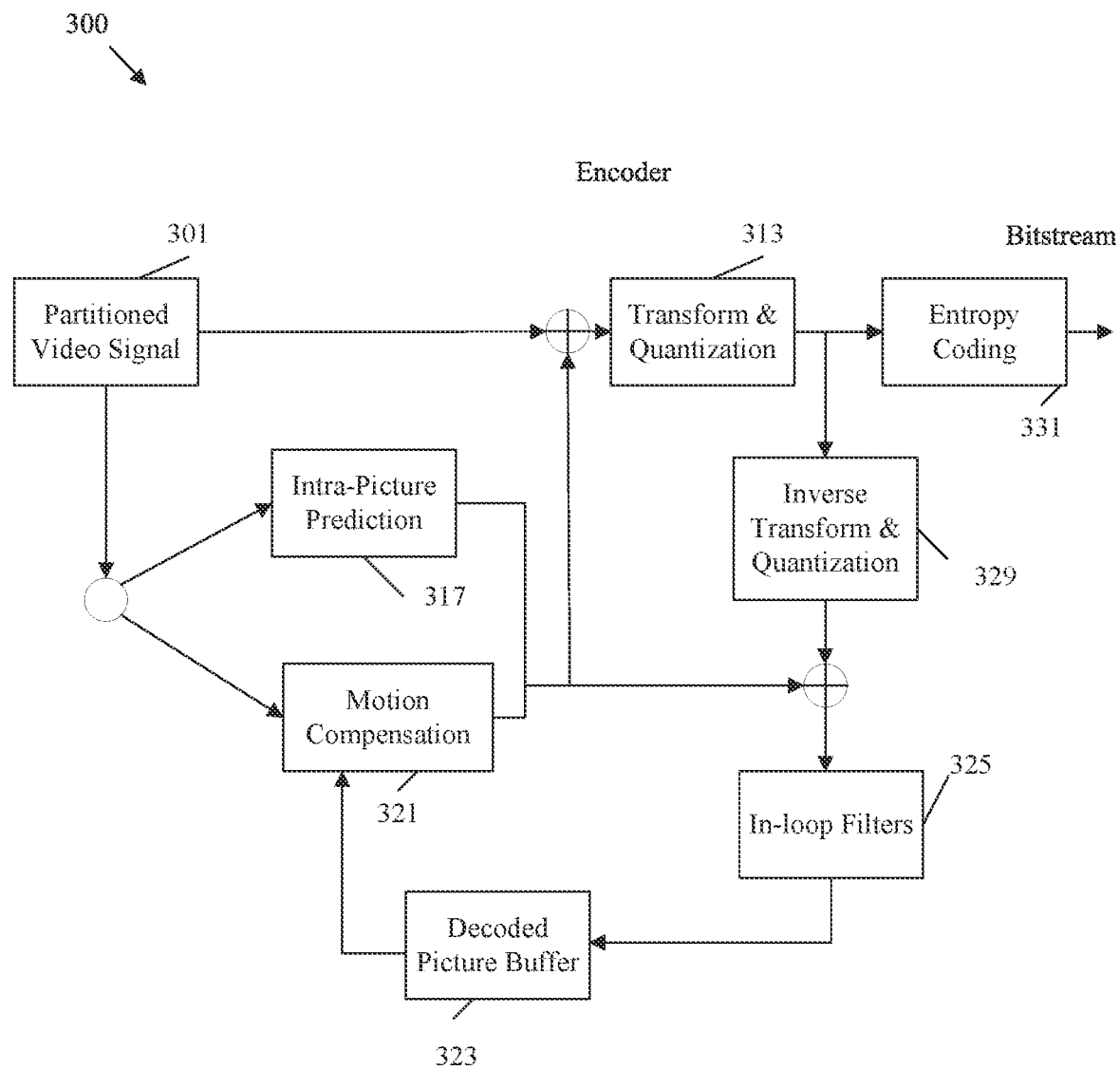
FIG. 3 is a schematic diagram illustrating an example video encoder.

FIG. 3 is a block diagram illustrating an example video encoder 300. Video encoder 300 may be employed to implement the encoding functions of codec system 200 and/or implement steps 101, 103, 105, 107, and/or 109 of operating method 100. Encoder 300 partitions an input video signal, resulting in a partitioned video signal 301, which is substantially similar to the partitioned video signal 201. The partitioned video signal 301 is then compressed and encoded into a bitstream by components of encoder 300.

Specifically, the partitioned video signal 301 is forwarded to an intra-picture prediction component 317 for intra-prediction. The intra-picture prediction component 317 may be substantially similar to intra-picture estimation component 215 and intra-picture prediction component 217. The partitioned video signal 301 is also forwarded to a motion compensation component 321 for inter-prediction based on reference blocks in a decoded picture buffer component 323. The motion compensation component 321 may be substantially similar to motion estimation component 221 and motion compensation component 219. The prediction blocks and residual blocks from the intra-picture prediction component 317 and the motion compensation component 321 are forwarded to a transform and quantization component 313 for transform and quantization of the residual blocks. The transform and quantization component 313 may be substantially similar to the transform scaling and quantization component 213. The transformed and quantized residual blocks and the corresponding prediction blocks (along with associated control data) are forwarded to an entropy coding component 331 for coding into a bitstream. The entropy coding component 331 may be substantially similar to the header formatting and CABAC component 231.

The transformed and quantized residual blocks and/or the corresponding prediction blocks are also forwarded from the transform and quantization component 313 to an inverse transform and quantization component 329 for reconstruction into reference blocks for use by the motion compensation component 321. The inverse transform and quantization component 329 may be substantially similar to the scaling and inverse transform component 229. In-loop filters in an in-loop filters component 325 are also applied to the residual blocks and/or reconstructed reference blocks, depending on the example. The in-loop filters component 325 may be substantially similar to the filter control analysis component 227 and the in-loop filters component 225. The in-loop filters component 325 may include multiple filters as discussed with respect to in-loop filters component 225. The filtered blocks are then stored in a decoded picture buffer component 323 for use as reference blocks by the motion compensation component 321. The decoded picture buffer component 323 may be substantially similar to the decoded picture buffer component 223.

Figure 4:
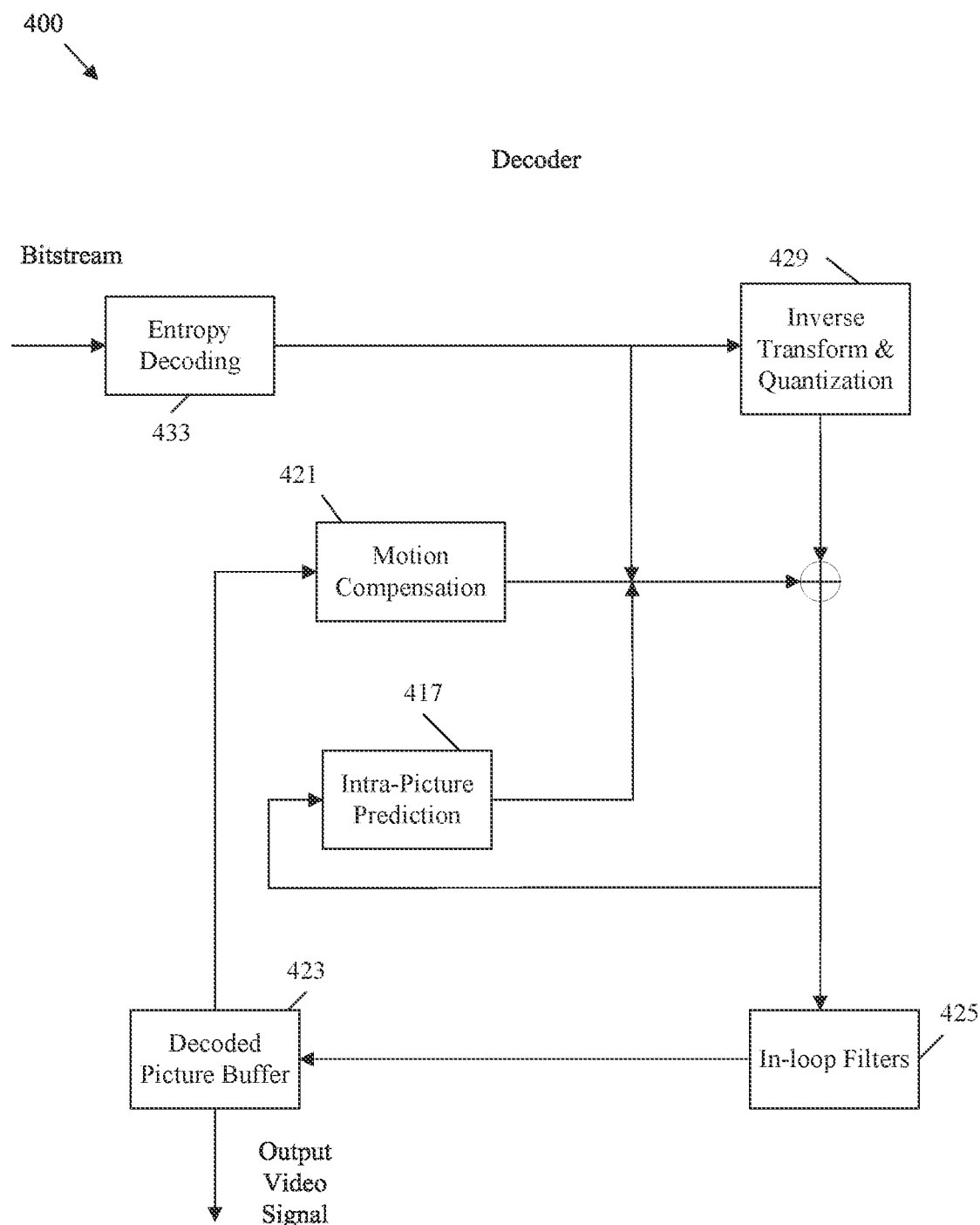
FIG. 4 is a schematic diagram illustrating an example video decoder.

FIG. 4 is a block diagram illustrating an example video decoder 400. Video decoder 400 may be employed to implement the decoding functions of codec system 200 and/or implement steps 111, 113, 115, and/or 117 of operating method 100. Decoder 400 receives a bitstream, for example from an encoder 300, and generates a reconstructed output video signal based on the bitstream for display to an end user.

The bitstream is received by an entropy decoding component 433. The entropy decoding component 433 is configured to implement an entropy decoding scheme, such as CAVLC, CABAC, SBAC, PIPE coding, or other entropy coding techniques. For example, the entropy decoding component 433 may employ header information to provide a context to interpret additional data encoded as codewords in the bitstream. The decoded information includes any desired information to decode the video signal, such as general control data, filter control data, partition information, motion data, prediction data, and quantized transform coefficients from residual blocks. The quantized transform coefficients are forwarded to an inverse transform and quantization component 429 for reconstruction into residual blocks. The inverse transform and quantization component 429 may be similar to inverse transform and quantization component 329.

The reconstructed residual blocks and/or prediction blocks are forwarded to intra-picture prediction component 417 for reconstruction into image blocks based on intra-prediction operations. The intra-picture prediction component 417 may be similar to intra-picture estimation component 215 and an intra-picture prediction component 217. Specifically, the intra-picture prediction component 417 employs prediction modes to locate a reference block in the frame and applies a residual block to the result to reconstruct intra-predicted image blocks. The reconstructed intra-predicted image blocks and/or the residual blocks and corresponding inter-prediction data are forwarded to a decoded picture buffer component 423 via an in-loop filters component 425, which may be substantially similar to decoded picture buffer component 223 and in-loop filters component 225, respectively. The in-loop filters component 425 filters the reconstructed image blocks, residual blocks and/or prediction blocks, and such information is stored in the decoded picture buffer component 423. Reconstructed image blocks from decoded picture buffer component 423 are forwarded to a motion compensation component 421 for inter-prediction. The motion compensation component 421 may be substantially similar to motion estimation component 221 and/or motion compensation component 219. Specifically, the motion compensation component 421 employs motion vectors from a reference block to generate a prediction block and applies a residual block to the result to reconstruct an image block. The resulting reconstructed blocks may also be forwarded via the in-loop filters component 425 to the decoded picture buffer component 423. The decoded picture buffer component 423 continues to store additional reconstructed image blocks, which can be reconstructed into frames via the partition information. Such frames may also be placed in a sequence. The sequence is output toward a display as a reconstructed output video signal.

Figure 5:
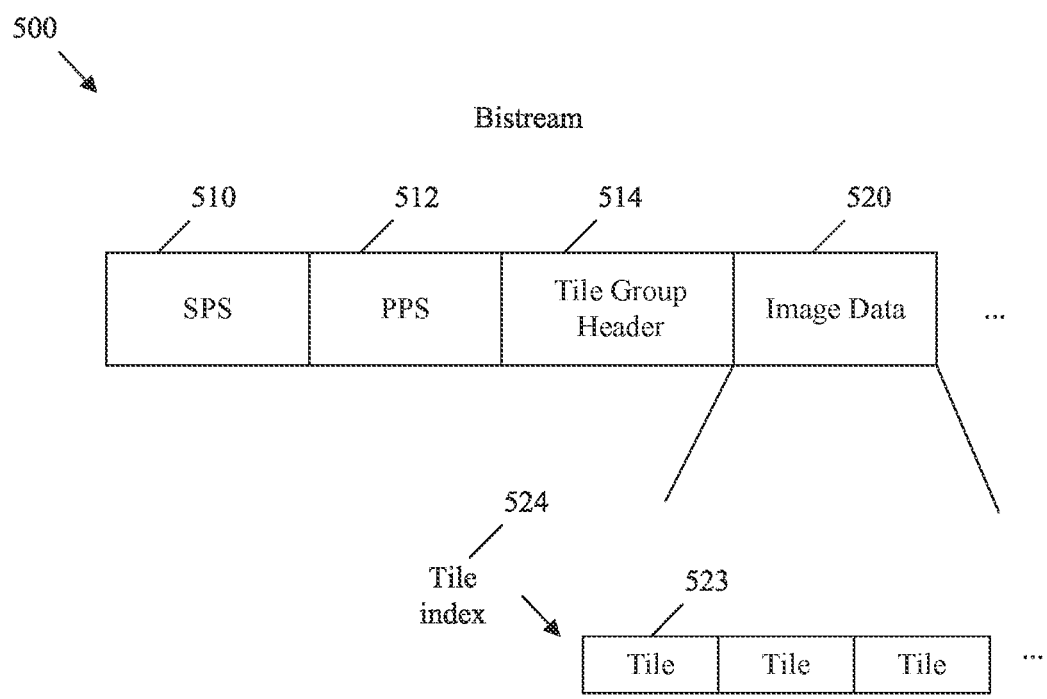
FIG. 5 is a schematic diagram illustrating an example bitstream containing an encoded video sequence.

FIG. 5 is a schematic diagram illustrating an example bitstream 500 containing an encoded video sequence. For example, the bitstream 500 can be generated by a codec system 200 and/or an encoder 300 for decoding by a codec system 200 and/or a decoder 400. As another example, the bitstream 500 may be generated by an encoder at step 109 of method 100 for use by a decoder at step 111.

The bitstream 500 includes a sequence parameter set (SPS) 510, a plurality of picture parameter sets (PPSs) 512, a tile group headers 514, and image data 520. An SPS 510 contains sequence data common to all the pictures in the video sequence contained in the bitstream 500. Such data can include picture sizing, bit depth, coding tool parameters, bit rate restrictions, etc. The PPS 512 contains parameters that are specific to one or more corresponding pictures. Hence, each picture in a video sequence may refer to one PPS 512. The PPS 512 can indicate coding tools available for tiles in corresponding pictures, quantization parameters, offsets, picture specific coding tool parameters (e.g., filter controls), etc. The tile group header 514 contains parameters that are specific to each tile group in a picture. Hence, there may be one tile group header 514 per tile group in the video sequence. The tile group header 514 may contain tile group information, picture order counts (POCs), reference picture lists, prediction weights, tile entry points, deblocking parameters, etc. It should be noted that some systems refer to the tile group header 514 as a slice header, and use such information to support slices instead of tile groups.

The image data 520 contains video data encoded according to inter-prediction and/or intra-prediction as well as corresponding transformed and quantized residual data. Such image data 520 is sorted according to the partitioning used to partition the image prior to encoding. For example, the image in the image data 520 is divided into tiles 523. The tiles 523 are further divided into coding tree units (CTUs). The CTUs are further divided into coding blocks based on coding trees. The coding blocks can then be encoded/decoded according to prediction mechanisms. An image/picture can contain one or more tiles 523.

A tile 523 is a partitioned portion of a picture created by horizontal and vertical boundaries. Tiles 523 may be coded in raster scan order, and may or may not allow prediction based on other tiles 523, depending on the example. Each tile 523 may have a unique tile index 524 in the picture. A tile index 524 is a procedurally selected numerical identifier that can be used to distinguish one tile 523 from another. For example, tile indices 524 may increase numerically in raster scan order. Raster scan order is left to right and top to bottom. It should be noted that, in some examples, tiles 523 may also be assigned tile identifiers (IDs). A tile ID is an assigned identifier that can be used to distinguish one tile 523 from another. Computations may employ tile IDs instead of tile indices 524 in some examples. Further, tile IDs can be assigned to have the same values as the tile indices 524 in some examples.

Tile indices 524 may be signaled to indicate tile groups containing the tiles 523. For example, the tiles 523 may be part of a tile group that wraps around the picture boundaries. A flag, such as an arbitrary_tile_group_present_flag, can be set in the tile group header 514 to indicate that an arbitrary tile group is in use. An arbitrary tile group is a tile group that is not limited to a rectangular grouping of adjacent tiles 523. A first tile index and a last tile index can be signaled in the tile group header 514. In some examples, the first tile index and last tile index are signaled by corresponding tile IDs. The decoder can then determine the configuration of the tile group based on the flag, the first tile index, and the last tile index. For example, the decoder can determine the configuration of the tile group by employing a predefined algorithm as described in more detail with respect to FIGS. 6A-6D below. The encoder may also employ the predefined algorithm during a rate distortion optimization process as the encoder employs similar procedures to the decoder in order to predict the decoding results at the decoder when selecting an optimized encoding approach. By signaling only the first tile index and the last tile index instead of the complete membership of the tile group, a substantial number of bits can be omitted. This increases coding efficiency, and hence reduces memory resource usage and network resource usage for both the encoder and decoder. As such, providing a predefined algorithm to determine a tile group configuration for a wrap-around tile group based on a first tile index and a last tile index provides additional functionality and flexibility for encoding optimization while maintaining such coding efficiency.

FIGS. 6A-6D illustrate example pictures 601, 611, 621, and 631 partitioned into example tile groups 609, 619, 629, and 639, respectively. For example, pictures 601, 611, 621, and 631 can be encoded in and decoded from a bitstream 500, for example by a codec system 200, an encoder 300, and/or a decoder 400. Further, pictures 601, 611, 621, and 631 can be partitioned to support encoding and decoding according to method 100. FIGS. 6A-6D illustrate example arbitrary tile groups. Accordingly, a decoder reading a flag indicating an arbitrary tile group should be able to determine which of the types of tile groups 609, 619, 629, and 639 are employed and determine a corresponding tile group configuration based solely on a first tile index and last tile index (or corresponding first tile ID and last tile ID).

Figures 6A, 6B:
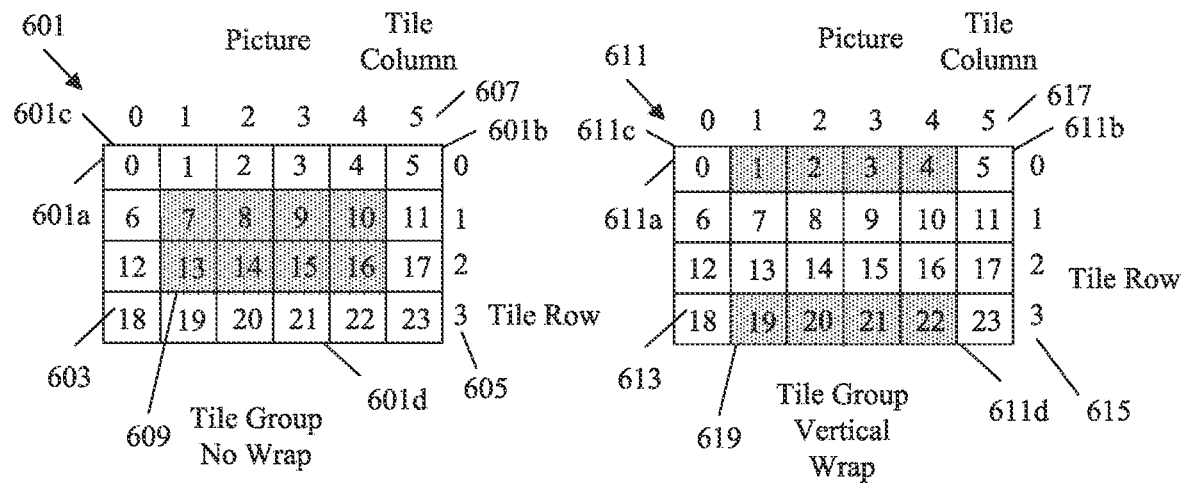
FIGS. 6A-6D illustrate example pictures partitioned into example tile groups.

Referring to FIG. 6A, a picture 601 is a single picture 601 in a video sequence. A picture 601 may be encoded into a bitstream by an encoder and decoded from the bitstream by a decoder. The picture 601 may contain a left boundary 601a, a right boundary 601b, a top boundary 601c, and a bottom boundary 601d, which are picture 601 edges included for clarity of discussion. The picture 601 can be partitioned into tiles 603.

A tile 603 is a sub-portion of a picture 601. A tile 603 may be substantially similar to a tile 523. Tiles 603 may be rectangular or square. Further, the tiles 603 may be partitioned into tile rows 605 and tile columns 607. A tile row 605 is a set of tiles 603 positioned in a horizontally adjacent manner to create a continuous line from the left boundary 601a to the right boundary 601b (or vice versa). A tile column 607 is a set of tiles 603 positioned in a vertically adjacent manner to create a continuous line from the top boundary 601c to the bottom boundary 601d (or vice versa). The tiles 603 are each assigned a tile index, which increases in raster scan order. In the example shown, the tile indices extend from zero to twenty three. Such tile indices are exemplary and provided for clarity of discussion, and therefore should not be considered limiting. The tiles 603 are included in one or more tile groups 609.

A tile group 609 is a related set of tiles 603 that can be separately extracted and coded, for example to support display of a region of interest and/or to support parallel processing. Tiles 603 in a tile group 609 can be coded without reference to tiles 603 outside of the tile group 609. Each tile 603 may be assigned to a corresponding tile group 609, and therefore a picture 601 can contain a plurality of tile groups. However, for clarity of discussion, the present disclosure refers to the tile group 609 depicted as a shaded region including tiles 603 with indices seven through ten and thirteen through sixteen.

Accordingly, the tile group 609 of picture 601 can be signaled by a first tile index of seven and a last tile index of sixteen. A decoder may wish to determine a configuration of the tile group 609 based on the first tile index and the last tile index. As used herein, a tile group 609 configuration indicates the rows, columns, and tiles 603 in the tile group 609. In order to determine the tile group 609 configuration a video coding device can employ a predefined algorithm. For example, a video coding device determining a number of tiles 603 in the tile group 609 partitioned from the picture 601 by setting a delta tile index as a difference between a last tile index of the tile group 609 and a first tile index of the tile group 609. A number of tile rows 605 in the tile group 609 can be determined by dividing the delta tile index by a number of tile columns 607 in the picture 601 plus one. Further, a number of tile columns 607 in the tile group 609 can be determined as the delta tile index modulo the number of tile columns 607 in the picture plus one. The number of tiles 603 in the tile group 609 can be determined by multiplying the number of tile columns 607 in the tile group 609 by the number of tile rows 605 in the tile group 609.

Referring now to FIG. 6B, a picture 611 is substantially similar to picture 601 with a different tile group 619. Accordingly, the picture 611 contains left boundary 611a, a right boundary 611b, a top boundary 611c, a bottom boundary 611d, tiles 613, tile rows 615, and tile columns 617, which are substantially similar to left boundary 601a, right boundary 601b, top boundary 601c, bottom boundary 601d, tiles 603, tile rows 605, and tile columns 607, respectively. Picture 611 also contains a tile group 619, which is similar to tile group 609. However, tile group 619 extends across the top boundary 611c and the bottom boundary 611d. Specifically, the tile group 619 has a first tile index of nineteen and a last tile index of four. Accordingly, the tile group 619 is a rectangular shape that wraps around the picture 611 in a vertical direction. A video coding device can determine the tile group 619 configuration in substantially the same manner as tile group 609. However, the predefined algorithm may determine the presence of a vertical wrap and adjust the delta tile index to adjust for the wrap. For example, prior to determining the number of tile rows 615 and the number of tile columns 617 in the tile group 619, the predefined algorithm can detect the vertical wrap. As a specific example, predefined algorithm can determine that the last tile index of the tile group 619 (e.g., four) is less than the first tile index of the tile group 619 (e.g., nineteen), which indicates a vertical wrap. The predefined algorithm can also determine a first tile column 617 index (e.g., one) is not greater than a last tile column 617 index (e.g. four), which indicates no horizontal wrap. Based on the determination of a vertical wrap and no horizontal wrap, the delta tile index can be increased by a number of tiles 613 in the picture 611 prior to determining the number of tiles 613, tile rows 615, and tile columns 617 in the tile group 619.

Figures 6C, 6D:
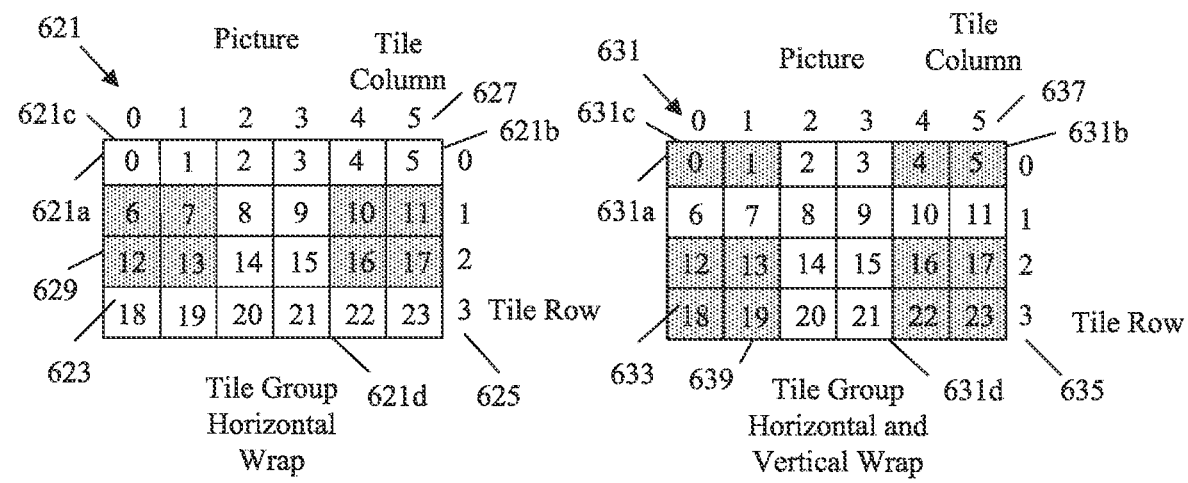

Referring now to FIG. 6C, a picture 621 is substantially similar to picture 601 with a different tile group 629. Accordingly, the picture 621 contains left boundary 621a, a right boundary 621b, a top boundary 621c, a bottom boundary 621d, tiles 623, tile rows 625, and tile columns 627, which are substantially similar to left boundary 601a, right boundary 601b, top boundary 601c, bottom boundary 601d, tiles 603, tile rows 605, and tile columns 607, respectively. Picture 621 also contains a tile group 629, which is similar to tile group 609. However, tile group 629 extends across the left boundary 621a and the right boundary 621b. Specifically, the tile group 629 has a first tile index of ten and a last tile index of thirteen. Accordingly, the tile group 629 is a rectangular shape that wraps around the picture 621 in a horizontal direction. A video coding device can determine the tile group 629 configuration in substantially the same manner as tile group 609. However, the predefined algorithm may determine the presence of a horizontal wrap and adjust the delta tile index to adjust for the wrap. For example, prior to determining the number of tile rows 625 and the number of tile columns 627 in the tile group 629, the predefined algorithm can detect the horizontal wrap. As a specific example, the predefined algorithm can determine that the last tile index of the tile group 629 (e.g., thirteen) is not less than the first tile index of the tile group 629 (e.g., ten), which indicates no vertical wrap. The predefined algorithm can also determine the first tile column 627 index (e.g., four) is greater than a last tile column 627 index (e.g., one), which indicates a horizontal wrap. Based on the determination of no vertical wrap and a horizontal wrap, the delta tile index can be increased by a number of tile columns 627 in the picture 621 prior to determining the number of tiles 623, tile rows 625, and tile columns 627 in the tile group 629.

Referring now to FIG. 6D, a picture 631 is substantially similar to picture 601 with a different tile group 639. Accordingly, the picture 631 contains left boundary 631a, a right boundary 631b, a top boundary 631c, a bottom boundary 631d, tiles 633, tile rows 635, and tile columns 637, which are substantially similar to left boundary 601a, right boundary 601b, top boundary 601c, bottom boundary 601d, tiles 603, tile rows 605, and tile columns 607, respectively. Picture 631 also contains a tile group 639, which is similar to tile group 609. However, tile group 639 extends across the left boundary 621a and the right boundary 621b in the horizontal direction and the top boundary 631c and bottom boundary 631d in the vertical direction. Specifically, the tile group 639 has a first tile index of sixteen and a last tile index of one. Accordingly, the tile group 639 is a rectangular shape that wraps around the picture 631 in a horizontal direction and a vertical direction. A video coding device can determine the tile group 639 configuration in substantially the same manner as tile group 609. However, the predefined algorithm may determine the presence of a horizontal wrap and a vertical wrap and adjust the delta tile index to adjust for the wraps. For example, prior to determining the number of tile rows 635 and the number of tile columns 637 in the tile group 639, the predefined algorithm can detect the horizontal wrap and the vertical wrap. As a specific example, the predefined algorithm can determine that the last tile index of the tile group 639 (e.g., one) is less than the first tile index of the tile group 639 (e.g., sixteen), which indicates a vertical wrap. The predefined algorithm can also determine the first tile column 637 index (e.g., four) is greater than a last tile column 637 index (e.g. one), which indicates a horizontal wrap. Based on the determination of a vertical wrap and a horizontal wrap, the delta tile index can be increased by a number of tiles 633 in the picture 631 and a number of tile columns 637 in the picture 631 prior to determining the number of tiles 633, tile rows 635, and tile columns 637 in the tile group 639.

As shown by the preceding description, the predefined algorithm can determine the tile group configuration without receiving data indicating the type of wrap(s) associated with the tile group. In a particular implementation, the following syntax can describe the preceding predefined algorithm.

```
firstTileIdx = TileIdToIdx[ first_tile_id ]
firstTileColumnIdx = firstTileIdx % ( num_tile_columns_minus1 + 1)
firstTileRowIdx = firstTileIdx / ( num_tile_columns_minus1 + 1)
lastTileIdx = TileIdToIdx[ last_tile_id ]
lastTileColumnIdx = lastTileIdx % ( num_tile_columns_minus1 + 1 )
lastTileRowIdx = lastTileIdx / ( num_tile_columns_minus1 + 1)
deltaTileIdx =lastTileIdx - firstTileIdx
if( lastTileIdx < firstTileIdx ) 1
   if( firstTileColumnIdx > lastTileColumnIdx )
      deltaTileIdx += NumTilesInPic + num_tile_columns_minus1 + 1
   else
      deltaTileIdx += NumTilesInPic
} else if( firstTileColumnIdx > lastTileColumnIdx )
   deltaTileIdx += num_tile_columns_minus1 + 1
numTileRowsInTileGroup = ( deltaTileIdx / ( num_tile_columns_minus1 +1 ) ) + 1
numTileColumnsInTileGroup = ( deltaTileIdx % ( num_tile_columns_minus1 +1 ) ) + 1
NumTilesInTileGroup = numTileRowsInTileGroup * numTileColuninsInTileGroup
```

The following is a particular example technique for signaling grouping of tiles and explicit signaling of the tile ID to facilitate extraction of the tile group from a bitstream without having to modify the tile group header as described herein. The tile group may be constrained such that the tiles that are grouped together into a tile group shall form a rectangular shape of area within a picture. The wrap-around tile group concept may be considered as a modification to a rectangular shape tile group. The tile group may wrap-around in a vertical direction as shown in FIG. 6B and/or in a horizontal direction as shown in FIG. 6C. In the example shown in FIG. 6B, the order of tiles within the tile group are as follows: tile at index 19, tile at index 20, tile at index 21, tile at index 22, tile at index 1, tile at index 2, tile at index 3, and tile at index 4. On the other hand, for the example shown in FIG. 6B, the order of tiles within the tile group are as follows: tile at index 10, tile at index 11, tile at index 6, tile at index 7, tile at index 16, tile at index 17, tile at index 12, and tile at index 14.

In a particular example, the variables numTileRowsInTileGroup, numTileColumnsInTileGroup, and NumTilesInTileGroup may be derived as follows:

```
deltaTileIdx = ( bottom_right_tile_id < top_left_tile_id ) ?
bottom_right_tile_id -topieft_tile_id + NumTilesInPic : ( ( topieft_tile_id %
( num_tile_columns_minus1 + 1 ) ) < ( bottom_right_tile_id %
( num_tile_columns_minus1 + 1 ) ) ) ? bottom_right_tile_id ? topieft_tile_id +
num_tile_columns_minus1 : bottom_right_tile_id ? topieft_tile_id
numTileRowsInTileGroup = ( deltaTileIdx / ( num_tile_columns_minus1 +1 ) ) + 1
numTileColumnsInTileGroup =
( deltaTileIdx % ( num_tile_columns_minus1 + 1 ) ) + 1
NumTilesInTileGroup = numTileRowsInTileGroup * numTileColuninsInTileGroup
```

The variables TgTileIdx[i] may specify the tile index of the i-th tile in the tile group and may be derived as follows:

```
tileIdx = top_left_tile_id
for( j = 0, tIdx = 0; j < numTileRowsInTileGroup; j++, tileIdx +=
num_tile_columns_minus1 +1) {
   for( i = 0, CurrTileIdx =tileIdx; i < numTileColumnsInTileGroup; i++,
CurrTileIdx++) {
      if( CurrTileIdx / numTileColumnsInTileGroup > tileIdx /
numTileColumnsInTileGroup)
         TgTileIdx[ tIdx ]=CurrTileIdx - numTileColumnsInTileGroup
      else if( CurrTileIdx / numTileColumnsInTileGroup >= numTileRowsInTileGroup )
         TgTileIdx[ tIdx ]= CurrTileIdx - NumTilesInPic
      else
         TgTileIdx[ tIdx ]=CurrTileIdx
   }
}
```

With the above derivation, the syntax table for tile group data can be defined as follows.

| | Descriptor |
|---|---|
| ```
tile_group_data( )
   for( i = 0; i < NumTilesInTileGroup; i++) {
      ctbAddrInTs = FirstCtbAddrTs[ TgTileIdx[ i ] ]
      for( j = 0; j < NumCtusInTile[ TgTileIdx[ i ] ]; j++, ctbAddrInTs++ ) {
         CtbAddrInRs = CtbAddrTsToRs[ ctbAddrInTs ]
``` | |

|  | Descriptor |
|---|---|
|       coding_tree_unit( ) <br>     } <br>     end_of_tile_one_bit /* equal to 1 */ <br>     if( i < NumTilesInTileGroup − 1) <br>       byte_alignment( ) <br>   } <br> } | ae(v) |

The arbitrary tile group concept allows flexibility to group two or more tiles into a group regardless of their location in the picture. However, some systems may constrain the tiles in the arbitrary tile group to conform to an order of increasing by tile index. To support such concept, the tile group signaling can be defined as follows:

|  | Descriptor |
|---|---|
| tile_group_header( ) { <br>   ... <br>   single_tile_in_tile_group_flag <br>   first_tile_id <br>   if( !single_tile_in_tile_group_flag ) { <br>     arbitrary_tile_group_flag <br>     if( !arbitrary_tile_group_flag ) <br>       last_tile_id <br>     else { <br>       num_remaining_tiles_in_tile_group_minus1 <br>       for( i = 0; i < NumTilesInTileGroup − 1; i++) <br>         delta_tile_idx_minus1[ i ] <br>       } <br>     } <br>   ... | <br><br><br>u(1)<br>u(v)<br><br>u(1)<br><br>u(v)<br><br>ue(v)<br><br>ue(v) |

The arbitrary_tile_group_flag can be set equal to one to specify that each tile index of the tile in the tile group is assigned explicitly using the syntax element delta_tile_idx[i]. The arbitrary_tile_group_flag can be set equal to zero to specify the tile index of the tile in the tile group is identified by the syntax elements first_tile_id and last_tile_id. The num_remaining_tiles_in_tile_group_minus1 may specify the number of tiles in the tile group excluding the first tile of the tile group. The length of num_remaining_tiles_in_tile_group_minus1 may be Ceil(Log 2(NumTilesInPic−1)) bits.

The variable NumTilesInTileGroup may be derived as follows:

NumTilesInTileGroup=num_remaining_tiles_in_tile_group_minus1+2

The delta_tile_idx_minus1[i] may specify the difference between the tile index of the i-th tile and the tile index of i-1th tile in the tile group. The tile index may be derived by delta_tile_idx[i] and may be signaled by increasing order. The value of tile index may not be equal to any other tile index in any other coded tile group of the same coded picture. The variable TgTileIdx[i] may be derived as follows:

TgTileIdx[ i ] = ( i > 0 ? TgTileIdx[ i ] − 1 ] + delta_tile_idx_minus1 [ i ] + 1 : first_tile_id The above syntax and semantics description for wrap-around and arbitrary tile group may not include the concept of explicit tile ID so that tile ID and tile index are the same.

Such approaches for wrap-around and arbitrary-shaped tile groups (or simply called arbitrary tile groups) have at least the following problems. The arbitrary-shaped tile group allows flexible tile grouping. However, in practice, arbitrary tile groups may be used rarely and only in specific application domains, for example for three hundred sixty degree video for sphere projection. Since such usage may be rare, requiring the syntax element arbitrary_tile_group_flag to always be signaled whenever a tile group has more than one tile may be inefficient. Further, to support arbitrary-shaped tile groups, the tiles that belong to a tile group may be listed explicitly in the tile group header. This naturally costs more bits compared to the signaling of rectangular tile groups by signaling the first and the last tile index or ID. To improve signaling efficiency, the disclosed approach simply signals the delta tile index between two consecutive tiles in the tile group. This may create problems when the explicit tile ID signaling is used since derivation of tile index of tiles in the tile group may result in an incorrect list of tile indices.

Also, some wrap-around tile group signaling may only support wrap-around in either vertical direction or horizontal direction, but not both. For example, the tile group as shown in FIG. 6D may not be supported by some signaling approaches. When a tile group is a wrap-around tile group in a vertical direction, an example wrap-around tile group signaling system allows the last tile and the first tile in the tile group to be located at tile rows that are consecutive. For example in FIG. 6B, the first tile is the tile at index 19 and the last tile is the tile at index 16. Likewise, when a tile group is a wrap-around tile group in a horizontal direction, the wrap-around tile group allows the last tile and the first tile in the tile group to be located at tile columns that are consecutive. For example, in FIG. 6C, the first tile is the tile at index 10 and the last tile is the tile at index 15. Such conditions may not be needed since such tile groups are simple rectangular shapes and there is no additional benefit to allow such tile grouping as they may cause unnecessary computational complexity for decoders.

In order to solve the abovementioned problems this disclosure includes the following example aspects. A flag is defined in a parameter set that is referred to directly or indirectly by a tile group. The flag specifies whether or not arbitrary-shaped tile groups are used. When the flag specifies that arbitrary-shaped tile groups are used, syntax element(s) related to an arbitrary-shaped tile group may be included in the tile group headers and may refer (directly or indirectly) to the parameter set. The flag can be signaled in a parameter set such as sequence parameter set, picture parameter set, or any other parameter set that is referred to directly or indirectly by tile groups. The flag may be called arbitrary_tile_group_present_flag.

In some aspects, when a tile group is an arbitrary tile group, instead of signaling the delta between the tile index values of two consecutive tiles in the tile group, the delta between the tile IDs of two consecutive tiles in the tile group can be signaled. In one alternative, when a tile group is an arbitrary tile group the tile ID can be directly signaled for each tile in the tile group, excluding the first tile. This can be employed instead of signaling the delta between the tile index values of two consecutive tiles in the tile group.

For wrap-around tile groups, wrap-around in both directions (e.g., vertical and horizontal directions) can be supported as follows. Wrap around in both vertical and horizontal directions can be identified by the condition in which the tile index of the first tile is greater than tile index of the last tile and tile column index of the first tile is greater than tile column of the last tile, assuming tile column index is defined in increasing order from left to right. Alternatively, wrap around in both vertical and horizontal directions can be identified by the condition in which tile row index of the first tile is greater than the tile index of the last tile and tile column index of the first tile is greater than tile column of the last tile, assuming tile column index is defined in increasing order from left to right and tile row index is defined in increasing order from top to bottom.

The list of tile indices associated with tiles that belong to a wrap-around tile group in both directions is described as follows. When explicit tile ID signaling is not enabled, any wrap-around tile group satisfying one of the following conditions may not be allowed. A wrap-around tile group where the tile row index of the first tile is greater than the tile row index of the last tile and the difference between these tile row indices is one. A wrap-around tile group with tile column index of the first tile that is greater than the tile column index of the last tile and the difference between these tile column indices is one.

The following describes a particular example implementation of the disclosed mechanisms. An example picture parameter set RBSP syntax is as follows.

|  | Descriptor |
|---|---|
| pic_parameter_set_rbsp( ) { | |
| ... | |
|   single_tile_in_pic_flag | u(1) |
|   if( !single_tile_in_pic_flag ) { | |
|     num_tile_columns_minus1 | ue(v) |
|     num_tile_rows_minus1 | ue(v) |
|   } | |
|   tile_id_len_minus1 | ue(v) |
|   explicit_tile_id_flag | u(1) |
|   if( explicit_tile_id_flag ) | |
|     for( i = 0; i <= num_tile_columns_minus1; i++) | |
|       for( j = 0; j <= num_tile_rows_minus1; j++ ) | |
|         tile_id_val[ i ][ j ] | u(v) |
|   if( !single_tile_in_pic_flag ) { | |
|     uniform_tile_spacing_flag | u(1) |
|     if( !uniform_tile_spacing_flag ) { | |
|       for( i = 0; i < num_tile_columns_minus1; i++) | |
|         tile_column_width_minus1[ i ] | ue(v) |
|       for( i = 0; i < num_tile_rows_minus1; i++) | |
|         tile_row_height_minus1[ i ] | ue(v) |
|     } | |
|     tile_boundary_treated_as_pic_boundary_flag | u(1) |
|     if( !tile_boundary_treated_as_pic_boundary_flag ) | |
|       loop_filter_across_tiles_enabled_flag | u(1) |
|   } | |
|   arbitrary_tile_group_present_flag | u(1) |
|   rbsp_trailing_bits( ) | |
| } | |

The tile_id_len_minus1 plus 1 may specify the number of bits used to represent the syntax element tile_id_val[i][j], when present, in the PPS, and the syntax element first_tile_id and last_tile_id in tile group headers referring to the PPS. The value of tile_id_len_minus1 may be in the range of Ceil(Log 2(NumTilesInPic) to fifteen, inclusive. The arbitrary_tile_group_present_flag can be set equal to one to specify that the syntax element arbitrary_tile_group_flag is present in tile group headers referring to the PPS. The arbitrary_tile_group_present_flag can be set equal to zero to specify that the syntax element arbitrary_tile_group_flag is not present in tile group headers referring to the PPS.

An example tile group header syntax is as follows:

|  | Descriptor |
|---|---|
| tile_group_header( ) { | |
| ... | |
|   single_tile_in_tile_group_flag // | u(1) |
|   first_tile_id | u(v) |
|   if( !single_tile_in_tile_group_flag ) { | |
|     if( arbitrary_tile_group_present_flag ) | |
|       arbitrary_tile_group_flag | u(1) |
|     if( !arbitrary_tile_group_flag ) | |
|       last_tile_id | u(v) |
|     else { | |
|       num_remaining_tiles_in_tile_group_minus1 | ue(v) |
|       for( i =0; i < NumTilesInTileGroup − 1; i++) | |
|         delta_tile_id_minus1[ i ] | ue(v) |
|       } | |
|     } | |
|   } | |
| ... | |
| } | |

The single_tile_in_tile_group_flag can be set equal to one to specify that there is only one tile in the tile group. The single_tile_in_tile_group_flag can be set equal to zero to specify that there is more than one tile in the tile group. The first_tile_id may specify the tile ID of the first tile of the tile group. The length of first_tile_id may be tile_id_len_minus1+1 bits. The value of first_tile_id may not be equal to the value of first_tile_id of any other coded tile group of the same coded picture. When there is more than one tile group in a picture, the decoding order of the tile groups in the picture may be in increasing value of first_tile_id. The arbitrary_tile_group_flag may be set equal to one to specify that the tiles in the tile group may be any set of two or more tiles of the picture and the tile ID of each of the tiles is explicitly signalled in the tile group header. The arbitrary_tile_group_flag can be set to zero to specify the tiles in the tile group are identified by the syntax elements first_tile_id and last_tile_id. When not present, the value of arbitrary_tile_group_flag is inferred to be equal to zero. The last_tile_id may specify the tile ID of the last tile of the tile group. The length of last_tile_id is tile_id_len_minus1+1 bits. When not present, the value of last_tile_id is inferred to be equal to first_tile_id.

When arbitrary_tile_group_flag is equal to zero, the variables numTileRowsInTileGroup, numTileColumnsInTileGroup, and NumTilesInTileGroup can be derived as follows:

firstTileIdx = TileIdToIdx + first_tile_id
firstTileColumnIdx = firstTileIdx % ( num_tile_columns_minus1 + 1)
firstTileRowIdx = firstTileIdx / ( num_tile_columns_minus1 + 1)

```
lastTileIdx = TileIdToIdx[ last_tile_id ]
lastTileColumnIdx = lastTileIdx % ( num_tile_columns_minus1 + 1)
lastTileRowIdx = lastTileIdx / ( num_tile_columns_minus1 + 1)
deltaTileIdx = lastTileIdx - firstTileIdx
if( lastTileIdx < firstTileIdx ) {
   if( firstTileColumnIdx > lastTileColumnIdx )
      deltaTileIdx += NumTilesInPic + num_tile_columns_minus1 + 1
   else
      deltaTileIdx += NumTilesInPic
} else if( firstTileColumnIdx > lastTileColumnIdx )
   deltaTileIdx += num_tile_columns_minus1 + 1
numTileRowsInTileGroup = ( deltaTileIdx / ( num_tile_columns_minus1 + 1 ) ) + 1
numTileColumnsInTileGroup =
( deltaTileIdx % ( num_tile_columns_minus1 + 1 ) ) + 1
NumTilesInTileGroup = numTileRowsInTileGroup * numTileColunmsInTileGroup
```

When explicit_tile_id_flag is equal to zero, the following bitstream conformance constraints may apply. If firstTileRowIdx is greater than lastTileRowIdx, the difference between firstTileRowIdx and lastTileRowIdx shall be greater than one. If firstTileColumnIdx is greater than lastTileColumnIdx, the difference between firstTileColumnIdx and lastTileColumnIdx shall be greater than one. When arbitrary_tile_group_flag is equal to zero, the variable TgTileIdx[i] specifies the tile index of the i-th tile in the tile group and may be derived as follows:

```
tileIdx = TileIdToIdx[ first_tile_id ]
for( j = 0, tIdx = 0; j < numTileRowsInTileGroup; j++, tileIdx +=
num_tile_columns_minus1 + 1) {
   tileIdx = tileIdx % NumTilesInPic
   for( i = 0, currTileIdx =tileIdx; i < numTileColuninsInTileGroup; i++,
currTileIdx++, tIdx++) {
      if( currTileIdx / ( num_tile_columns_minus1 +1) > tileIdx /
( num_tile_columns_minus1 + 1 ) )
         TgTileIdx[ tIdx ] = currTileIdx -
( num_tile_columns_minus1 + 1)
      else
         TgTileIdx[ tIdx ] = currTileIdx
   }
}
```

The num_remaining_tiles_in_tile_group_minus1 may specify the number of tiles in the tile group excluding the first tile of the tile group. The value of num_remaining_tiles_in_tile_group_minus1 may be in the range of 0 to NumTilesInPic−1, inclusive. When arbitrary_tile_group_flag is equal to one, the variable NumTilesInTileGroup may be derived as follows:

NumTilesInTileGroup=num_remaining_tiles_in_tile_group_minus1+2

The delta_tile_id_minus1[i] may specify the difference between the tile ID of the (i+1)-th tile and the tile ID of i-th tile in the tile group. The value of delta_tile_id_minus1[i] may be in the range of 0 to 2(tile_id_len_minus1+1)−1, inclusive. When arbitrary_tile_group_flag is equal to one, the variable TgTileIdx[i] for i in the range zero to NumTilesInTileGroup−1, inclusive, may be derived as follows:

```
tgTileId[ i ] = i > 0 - tgTileId[i - 1 ] + delta_tile_id_minus1 [i - 1 ] + 1 : first_tile_id
TgTileIdx[ i ] = TileIdToIdx[ tgTileId[ i ] + 9
```

An example general tile group data syntax is as follows:

| | Descriptor |
|---|---|
| tile_group_data( ) { <br>   for( i = 0; i < NumTilesInTileGroup; i++) { <br>     ctbAddrInTs = FirstCtbAddrTs[ TgTileIdx[ i ] ] <br>     for( j = 0; j < NumCtusInTile[ TgTileIdx[ i ] ]; j++, ctbAddrInTs++ ) { <br>       CtbAddrInRs = CtbAddrTsToRs[ ctbAddrInTs ] <br>       coding_tree_unit( ) <br>     } <br>     end_of_tile_one_bit /* equal to 1 */ | <br> <br> <br> <br> <br> <br> <br> <br> ae(v) |
|     if( i < NumTilesInTileGroup − 1) <br>       byte_alignment( ) <br>   } <br> } | |

Figure 7:
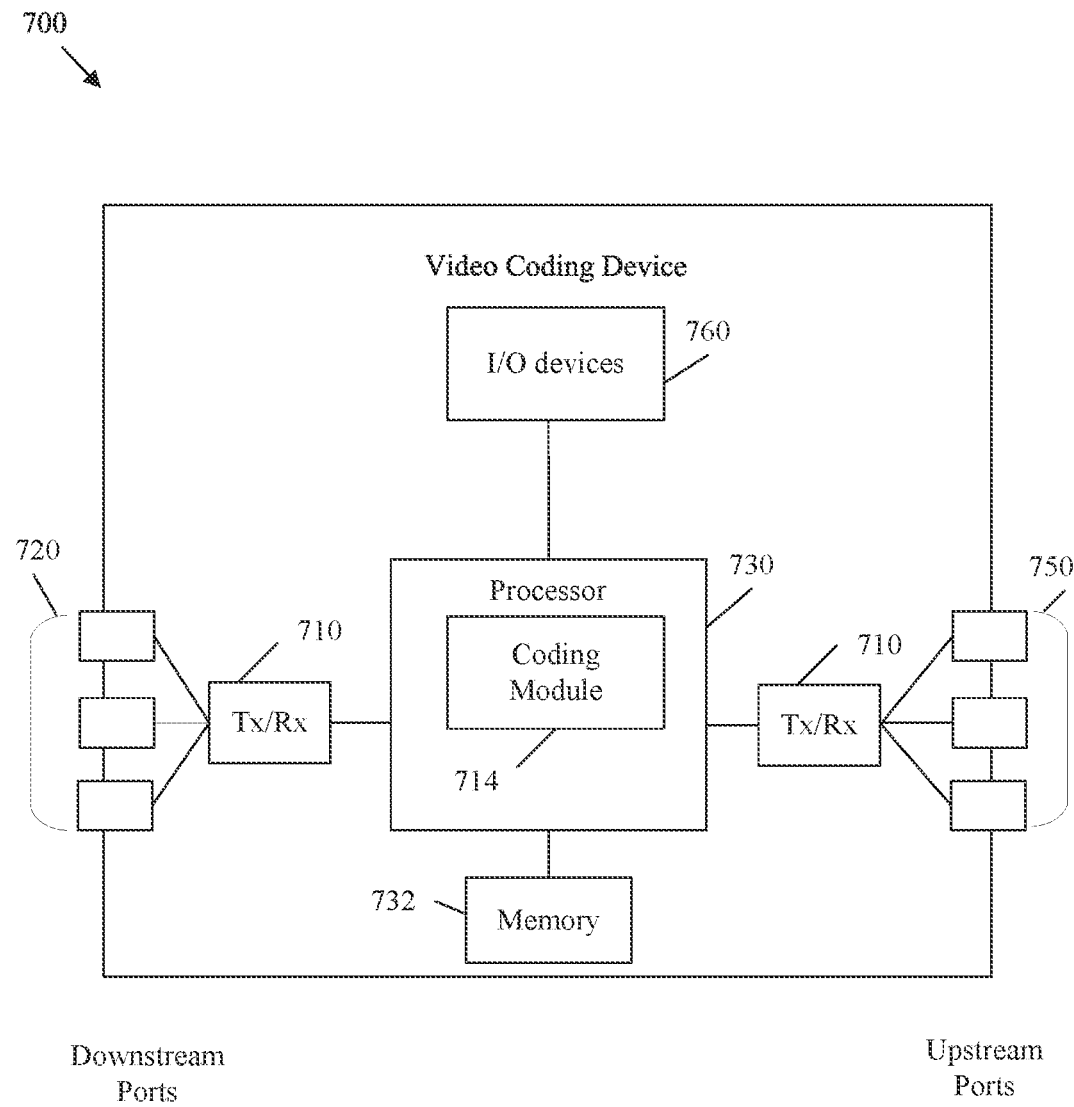
FIG. 7 is a schematic diagram of an example video coding device.

FIG. 7 is a schematic diagram of an example video coding device 700. The video coding device 700 is suitable for implementing the disclosed examples/embodiments as described herein. The video coding device 700 comprises downstream ports 720, upstream ports 750, and/or transceiver units (Tx/Rx) 710, including transmitters and/or receivers for communicating data upstream and/or downstream over a network. The video coding device 700 also includes a processor 730 including a logic unit and/or central processing unit (CPU) to process the data and a memory 732 for storing the data. The video coding device 700 may also comprise electrical, optical-to-electrical (OE) components, electrical-to-optical (EO) components, and/or wireless communication components coupled to the upstream ports 750 and/or downstream ports 720 for communication of data via electrical, optical, or wireless communication networks. The video coding device 700 may also include input and/or output (I/O) devices 760 for communicating data to and from a user. The I/O devices 760 may include output devices such as a display for displaying video data, speakers for outputting audio data, etc. The I/O devices 760 may also include input devices, such as a keyboard, mouse, trackball, etc., and/or corresponding interfaces for interacting with such output devices.

The processor 730 is implemented by hardware and software. The processor 730 may be implemented as one or more CPU chips, cores (e.g., as a multi-core processor), field-programmable gate arrays (FPGAs), application specific integrated circuits (ASICs), and digital signal processors (DSPs). The processor 730 is in communication with the downstream ports 720, Tx/Rx 710, upstream ports 750, and memory 732. The processor 730 comprises a coding module 714. The coding module 714 implements the disclosed embodiments described herein, such as methods 100, 800, 900, and 1000 which may employ a bitstream 500 and/or an image partitioned into tile groups 609, 619, 629, and/or 639. The coding module 714 may also implement any other method/mechanism described herein. Further, the coding module 714 may implement a codec system 200, an encoder 300, and/or a decoder 400. For example, when acting as an encoder, the coding module 714 can partition a picture into a tile group that wrap around the picture in the horizontal and/or vertical direction. The coding module 714 can also encode a flag in a parameter set to indicate an arbitrary tile group and signal a first and last tile index for the tile group. When acting as a decoder, the coding module 714 can read the flag indicating the arbitrary tile group as well as the first and last tile index for the tile group. At either the encoder or decoder, the coding module 714 can determine the nature of the tile group wrapping around the picture and adjust a delta tile index accordingly prior to using the delta tile index to determine the configuration of the tile group. As such, the coding module 714 improves the functionality of the video coding device 700 as well as addresses problems that are specific to the video coding arts by allowing for multiple types of tile group wrapping (and hence increasing coding efficiency) without negatively impacting tile group signaling. Further, the coding module 714 effects a transformation of the video coding device 700 to a different state. Alternatively, the coding module 714 can be implemented as instructions stored in the memory 732 and executed by the processor 730 (e.g., as a computer program product stored on a non-transitory medium).

The memory 732 comprises one or more memory types such as disks, tape drives, solid-state drives, read only memory (ROM), random access memory (RAM), flash memory, ternary content-addressable memory (TCAM), static random-access memory (SRAM), etc. The memory 732 may be used as an over-flow data storage device, to store programs when such programs are selected for execution, and to store instructions and data that are read during program execution.

Figure 8:
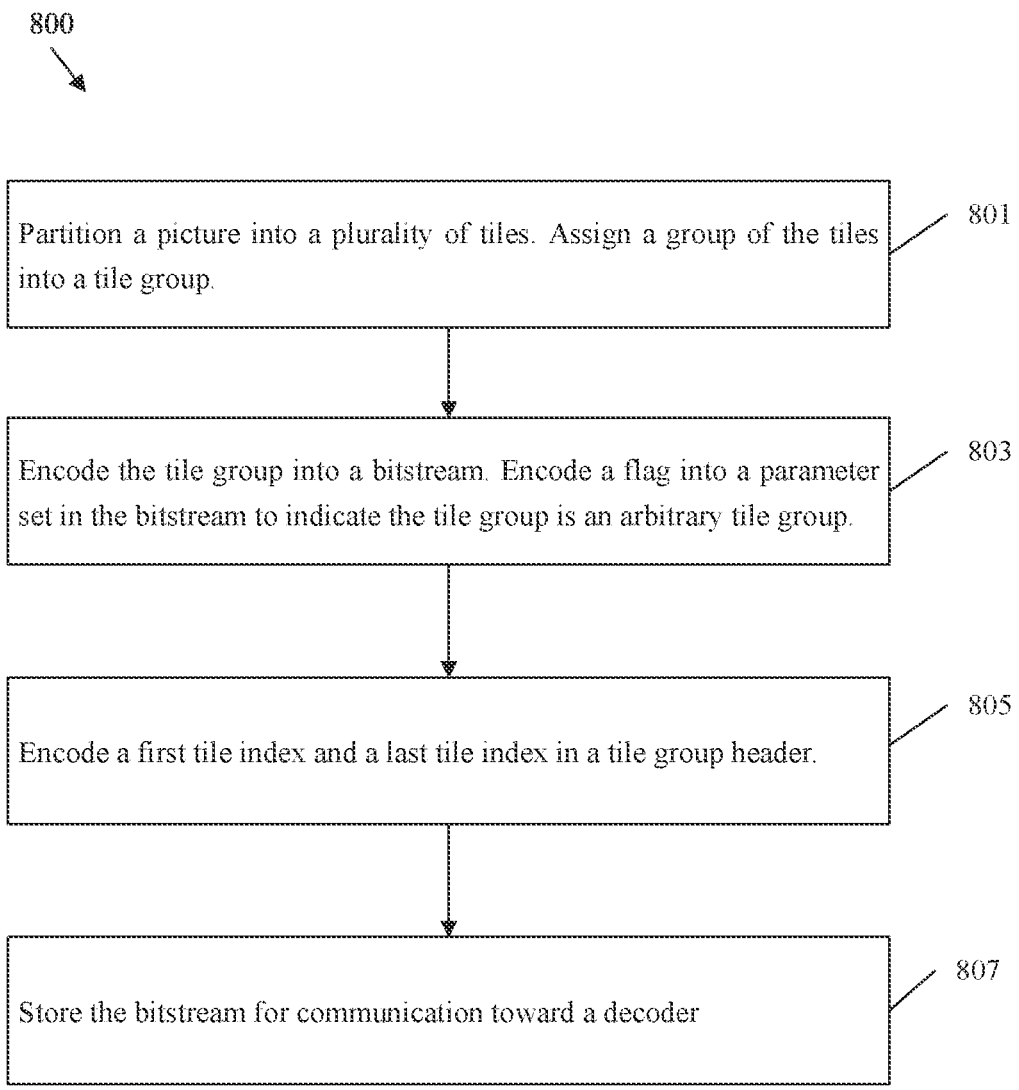
FIG. 8 is a flowchart of an example method of encoding an image with an arbitrary tile group into a bitstream.

FIG. 8 is a flowchart of an example method 800 of encoding an image, such as pictures 601, 611, 621, and 631, with an arbitrary tile group, such as tile groups 609, 619, 629, and 639, into a bitstream, such as bitstream 500. Method 800 may be employed by an encoder, such as a codec system 200, an encoder 300, and/or a video coding device 700 when performing method 100.

Method 800 may begin when an encoder receives a video sequence including a plurality of images and determines to encode that video sequence into a bitstream, for example based on user input. The video sequence is partitioned into pictures/images/frames for further partitioning prior to encoding. At step 801, a picture is partitioned into a plurality of tiles. The tiles can be further partitioned into a plurality of CTUs, which can be further partitioned into coding blocks for application of prediction based compression. A group of the tiles are also assigned into a tile group. In a particular example, the tile group is a rectangular shape that wraps around the picture in a horizontal direction and a vertical direction.

At step 803, the tile group is encoded into a bitstream. Further, a flag is encoded into a parameter set in the bitstream. The flag indicates the tile group is an arbitrary tile group. As a particular example, the flag is an arbitrary_tile_group_present_flag. For example, the flag can be encoded into a PPS associated with the picture.

At step 805, a first tile index and a last tile index can be encoded in a tile group header. The first tile index indicates a first tile in the first tile group. Further, the last tile index indicates a last tile in the first tile group. The first tile index and last tile index can be encoded to support determining a number of tiles in a tile group partitioned from the picture at a decoder. Further, an encoder can determine a number of tiles in a tile group partitioned from the picture based on the first tile index and last tile index as part of a rate distortion optimization process while predicting results at a decoder.

At step 807, the bitstream is stored for communication toward a decoder. The bitstream can then be transmitted toward the decoder upon request.

Figure 9:
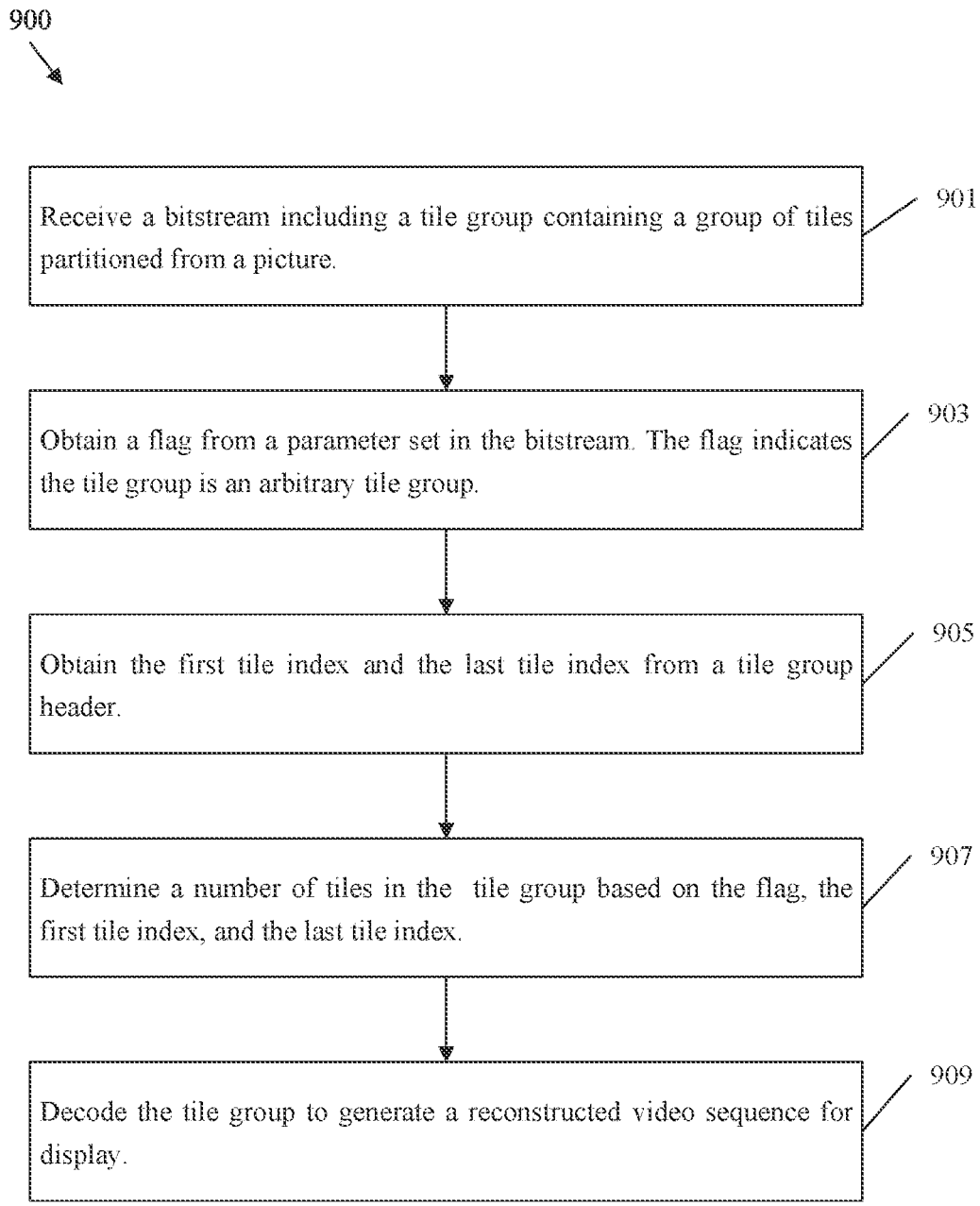
FIG. 9 is a flowchart of an example method of decoding an image with an arbitrary tile group from a bitstream.

FIG. 9 is a flowchart of an example method 900 of decoding an image, such as pictures 601, 611, 621, and 631, with an arbitrary tile group, such as tile groups 609, 619, 629, and 639, from a bitstream, such as bitstream 500. Method 900 may be employed by a decoder, such as a codec system 200, a decoder 400, and/or a video coding device 700 when performing method 100.

Method 900 may begin when a decoder begins receiving a bitstream of coded data representing a video sequence, for example as a result of method 800. At step 901, a bitstream is received at a decoder. The bitstream includes a tile group containing a group of tiles partitioned from a picture.

At step 903, a flag is obtained from a parameter set in the bitstream. The flag indicates the tile group is an arbitrary tile group. As a particular example, the flag is an arbitrary_tile_group_present_flag. For example, the flag can be obtained from a PPS associated with the picture. Based on the flag, the decoder can select a predefined algorithm to determine the configuration of the tiles in the tile group.

At step 905, a first tile index and a last tile index for the tile group can be obtained from a tile group header. The first tile index indicates a first tile in the tile group. The last tile index indicates a last tile in the tile group.

At step 907, a number of tiles in the tile group can be determined based on the flag, a first tile index, and a last tile index. As a particular example, the tile group may be a rectangular shape that wraps around the picture in a horizontal direction and a vertical direction. A predefined algorithm can be employed to determine the number of tiles in the tile group regardless of types of wrapping employed by the tile group.

At step 909, the first tile group can be decoded to reconstruct a portion of the picture, which can then be included as part of a reconstructed video sequence. The resulting reconstructed video sequence can be forwarded to a display device for display to a user.

Figure 10:
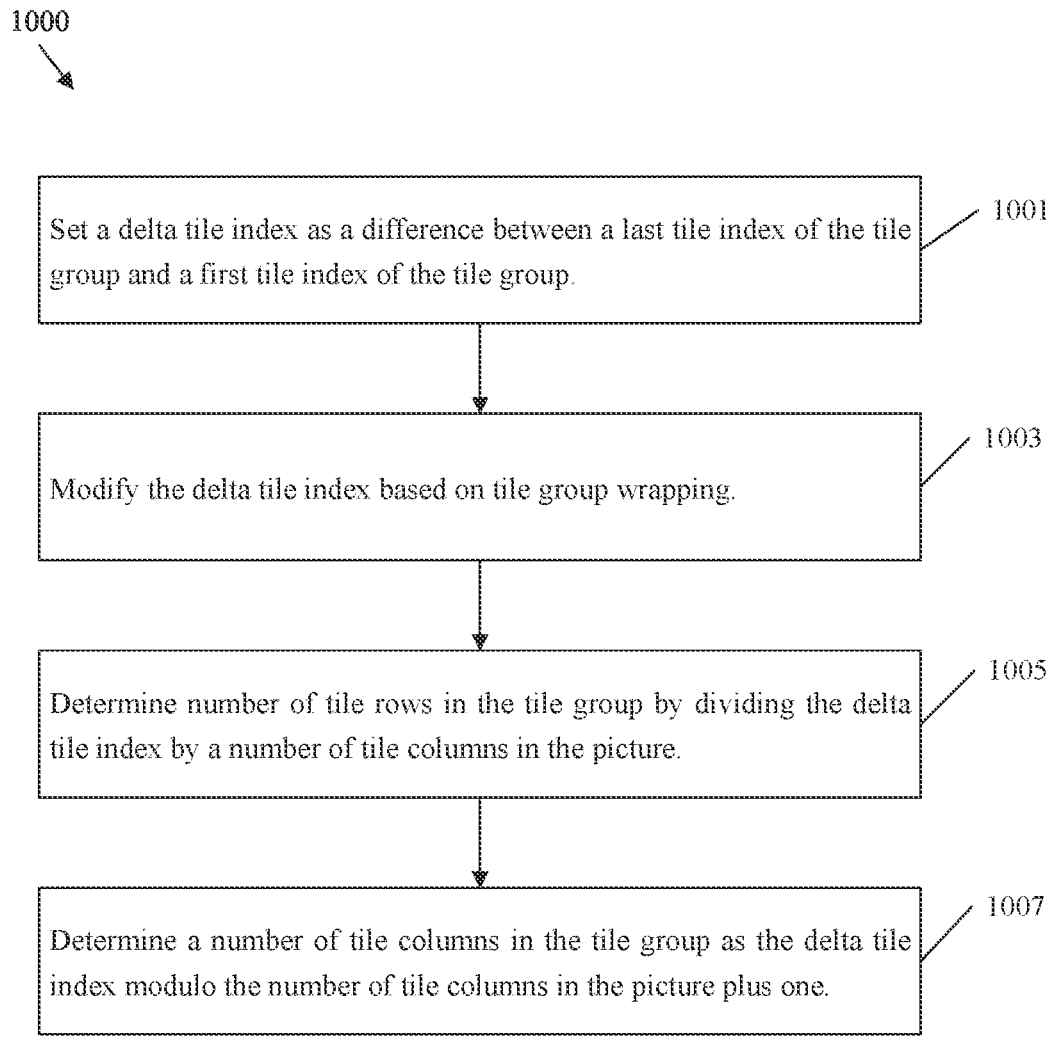
FIG. 10 is a flowchart of an example method of determining a tile group configuration from an arbitrary tile group based on a first tile index and a last tile index.

FIG. 10 is a flowchart of an example method 1000 of determining a tile group configuration from an arbitrary tile group, such as for tile groups 609, 619, 629, and/or 639, based on a first tile index and a last tile index. For example, method 1000 can be employed at an encoder as part of rate distortion optimization process or at a decoder as part of method 900 at step 907. As such, method 1000 can be employed to support method 800 and 900.

Accordingly, method 1000 may be employed by a video coding device, such as a codec system 200, an encoder 300, a decoder 400, and/or a video coding device 700 when performing method 100, for example with respect to a bitstream 500.

Method 1000 may begin when a video coding device decides to determine a number of tiles in a tile group partitioned from a picture based on a flag that indicates the tile group is an arbitrary tile group. At step 1001, a delta tile index is set as a difference between a last tile index of the tile group and a first tile index of the tile group.

At step 1003, the delta tile index is modified based on tile group wrapping. This may occur prior to determining a number of tile rows in the tile group and a number of tile columns in the tile group in steps 1005 and 1007. In a first example, the delta tile index is increased by a number of tiles in the picture and the number of tile columns in the picture when the last tile index of the tile group is less than the first tile index of the tile group, indicating a vertical wrap, and a first tile column index is greater than a last tile column index, indicating a horizontal wrap. In a second example, the delta tile index is increased by a number of tiles in the picture when the last tile index of the tile group is less than the first tile index of the tile group, indicating a vertical wrap, and a first tile column index is not greater than a last tile column index, indicating no horizontal wrap. In a third example, the delta tile index is increased by the number of tile columns in the picture when the last tile index of the tile group is not less than the first tile index of the tile group, indicating no vertical wrap, and a first tile column index is greater than a last tile column index, indicating a horizontal wrap.

At step 1005, a number of tile rows in the tile group is determined by dividing the delta tile index by a number of tile columns in the picture plus one. At step 1007, a number of tile columns in the tile group is determined as the delta tile index modulo the number of tile columns in the second picture plus one. Further, the number of tiles in the tile group is determined by multiplying the number of tile rows in the tile group by the number of tile columns in the tile group.

Figure 11:
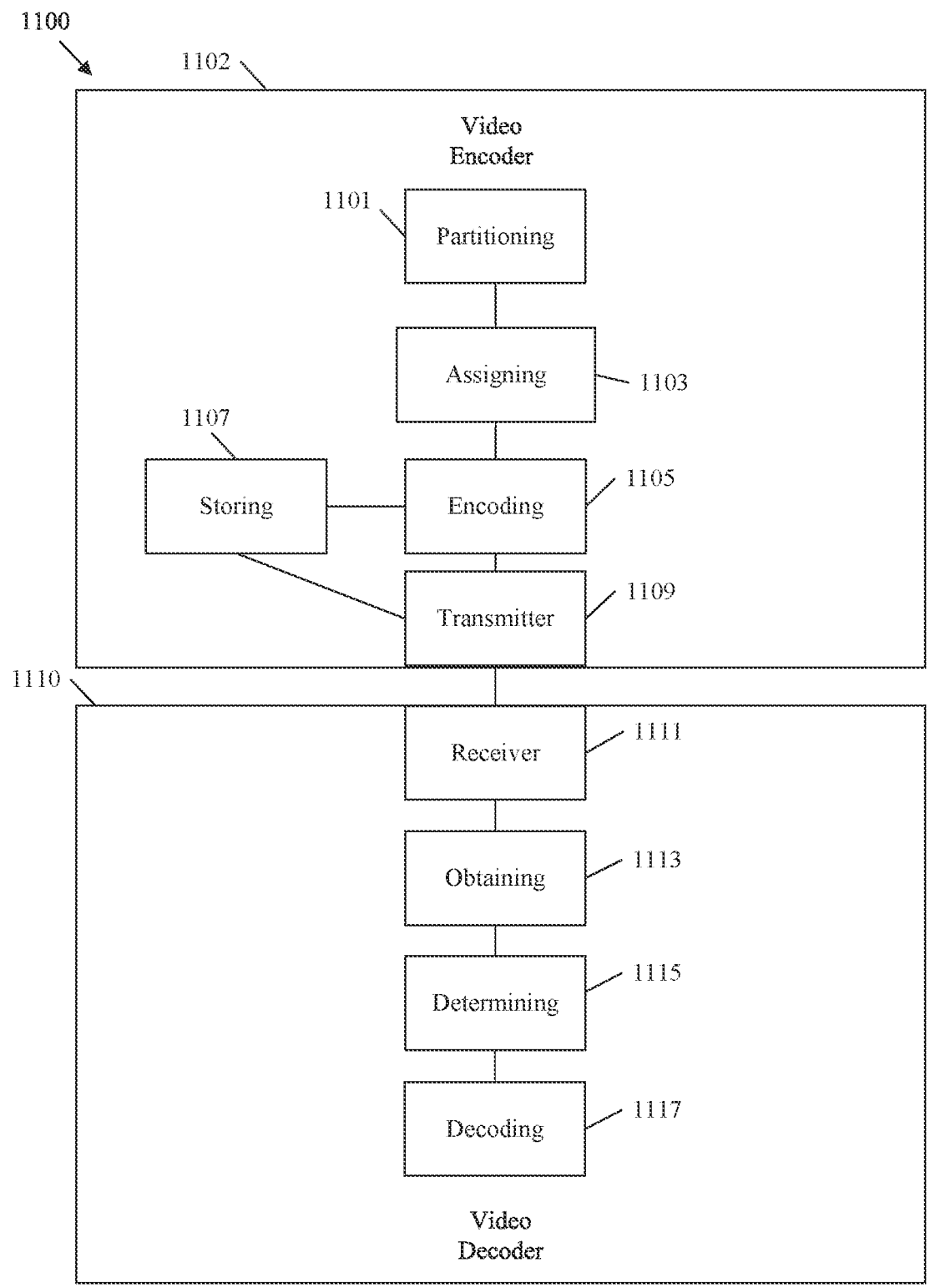
FIG. 11 is a schematic diagram of an example system for coding a video sequence of images in a bitstream.

FIG. 11 is a schematic diagram of an example system 1100 for coding a video sequence of images, such as pictures 601, 611, 621, and 631, in a bitstream, such as bitstream 500. System 1100 may be implemented by an encoder and a decoder such as a codec system 200, an encoder 300, a decoder 400, and/or a video coding device 700. Further, system 1100 may be employed when implementing method 100, 800, 900, and/or 1000.

The system 1100 includes a video encoder 1102. The video encoder 1102 comprises a partitioning module 1101 for partitioning a first picture into a plurality of tiles. The video encoder 1102 further comprises an assigning module 1103 for assigning a group of the tiles into a first tile group, wherein the first tile group is a rectangular shape that wraps around the first picture in a horizontal direction and a vertical direction. The video encoder 1102 further comprises an encoding module 1105 for encoding the first tile group into a bitstream and encoding a flag into a parameter set in the bitstream to indicate the first tile group is an arbitrary tile group. The video encoder 1102 further comprises a storing module 1107 for storing the bitstream for communication toward a decoder. The video encoder 1102 further comprises a transmitting module 1109 for transmitting the bitstream to support determining the configuration of the tile group and decoding the tiles at a decoder. The video encoder 1102 may be further configured to perform any of the steps of method 800 and/or 1000.

The system 1100 also includes a video decoder 1110. The video decoder 1110 comprises a receiving module 1111 for receiving a bitstream including a first tile group containing a group of tiles partitioned from a first picture. The video decoder 1110 further comprises an obtaining module 1113 for obtaining a flag from a parameter set in the bitstream, wherein the flag indicates the first tile group is an arbitrary tile group. The video decoder 1110 further comprises a determining module 1115 for determining a number of tiles in the first tile group based on the flag, a first tile index, and a last tile index, wherein the first tile group is a rectangular shape that wraps around the first picture in a horizontal direction and a vertical direction. The video decoder 1110 further comprises a decoding module 1117 for decoding the first tile group to generate a reconstructed video sequence for display. The video decoder 1110 may be further configured to perform any of the steps of method 900 and/or 1000.

A first component is directly coupled to a second component when there are no intervening components, except for a line, a trace, or another medium between the first component and the second component. The first component is indirectly coupled to the second component when there are intervening components other than a line, a trace, or another medium between the first component and the second component. The term "coupled" and its variants include both directly coupled and indirectly coupled. The use of the term "about" means a range including ±10% of the subsequent number unless otherwise stated.

It should also be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the present disclosure.

While several embodiments have been provided in the present disclosure, it may be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be com-

What is claimed is:

1. A method implemented by an encoder, the method comprising:
   partitioning, by the encoder, a first picture into a plurality of tiles;
   assigning, by the encoder, a group of the tiles into a first tile group, wherein the first tile group is a rectangular shape that wraps around the first picture in a horizontal direction and a vertical direction;
   encoding, by the encoder, the first tile group into a bitstream;
   encoding, by the encoder, a flag into a parameter set in the bitstream to indicate the first tile group is an arbitrary tile group;
   determining a number of tiles in a second tile group partitioned from a second picture by:
     setting a delta tile index as a difference between a last tile index of the second tile group and a first tile index of the second tile group;
     determining a number of tile rows in the second tile group by dividing the delta tile index by a number of tile columns in the second picture plus one; and
     determining a number of tile columns in the second tile group as the delta tile index modulo the number of tile columns in the second picture plus one; and
   storing, by the encoder, the bitstream for communication toward a decoder.

2. The method of claim 1, wherein the flag is an arbitrary_tile_group_present_flag.

3. The method of claim 1, wherein the flag is encoded into a picture parameter set (PPS) associated with the first picture.

4. The method of claim 1, further comprising encoding, by the encoder, a first tile index and a last tile index in a tile group header, wherein the first tile index indicates a first tile in the first tile group, and wherein the last tile index indicates a last tile in the first tile group.

5. The method of claim 1, wherein, prior to determining the number of tile rows in the second tile group and the number of tile columns in the second tile group, the delta tile index is increased by a number of tiles in the second picture and the number of tile columns in the second picture when the last tile index of the second tile group is less than the first tile index of the second tile group, indicating a vertical wrap, and a first tile column index is greater than a last tile column index, indicating a horizontal wrap.

6. The method of claim 1, wherein, prior to determining the number of tile rows in the second tile group and the number of tile columns in the second tile group, the delta tile index is increased by a number of tiles in the second picture when the last tile index of the second tile group is less than the first tile index of the second tile group, indicating a vertical wrap, and a first tile column index is not greater than a last tile column index, indicating no horizontal wrap.

7. The method of claim 1, wherein, prior to determining the number of tile rows in the second tile group and the number of tile columns in the second tile group, the delta tile index is increased by the number of tile columns in the second picture when the last tile index of the second tile group is not less than the first tile index of the second tile group, indicating no vertical wrap, and a first tile column index is greater than a last tile column index, indicating a horizontal wrap.

8. A method implemented by a decoder, the method comprising:
   receiving, by the decoder, a bitstream including a parameter set and a first tile group containing a group of tiles partitioned from a first picture;
   obtaining, by the decoder, a flag from the parameter set, wherein the flag indicates the first tile group is an arbitrary tile group;
   determining, by the decoder, a number of tiles in the first tile group based on the flag, a first tile index, and a last tile index, wherein the first tile group is a rectangular shape that wraps around the first picture in a horizontal direction and a vertical direction;
   determining a number of tiles in a second tile group partitioned from a second picture by:
     setting a delta tile index as a difference between a last tile index of the second tile group and a first tile index of the second tile group;
     determining a number of tile rows in the second tile group by dividing the delta tile index by a number of tile columns in the second picture plus one; and
     determining a number of tile columns in the second tile group as the delta tile index modulo the number of tile columns in the second picture plus one; and
   decoding, by the decoder, the first tile group to generate a reconstructed video sequence for display.

9. The method of claim 8, wherein the flag is an arbitrary_tile_group_present_flag.

10. The method of claim 8, wherein the flag is obtained from a picture parameter set (PPS) associated with the first picture.

11. The method of claim 8, further comprising obtaining, by the decoder, the first tile index and the last tile index from a tile group header, wherein the first tile index indicates a first tile in the first tile group, and wherein the last tile index indicates a last tile in the first tile group.

12. The method of claim 8, wherein, prior to determining the number of tile rows in the second tile group and the number of tile columns in the second tile group, the delta tile index is increased by a number of tiles in the second picture and the number of tile columns in the second picture when the last tile index of the second tile group is less than the first tile index of the second tile group, indicating a vertical wrap, and a first tile column index is greater than a last tile column index, indicating a horizontal wrap.

13. The method of claim 8, wherein, prior to determining the number of tile rows in the second tile group and the number of tile columns in the second tile group, the delta tile index is increased by a number of tiles in the second picture when the last tile index of the second tile group is less than the first tile index, indicating a vertical wrap, and a first tile column index is not greater than a last tile column index, indicating no horizontal wrap.

14. The method of claim 8, wherein, prior to determining the number of tile rows in the second tile group and the number of tile columns in the second tile group, the delta tile index is increased by the number of tile columns in the second picture when the last tile index of the second tile group is not less than the first tile index, indicating no vertical wrap, and a first tile column index is greater than a last tile column index, indicating a horizontal wrap.

15. A decoder comprising:
a receiver configured to receive a bitstream including a parameter set and a first tile group containing a group of tiles partitioned from a first picture; and
a processor configured to:
- obtain a flag from the parameter set, wherein the flag indicates the first tile group is an arbitrary tile group;
- determine a number of tiles in the first tile group based on the flag, a first tile index, and a last tile index, wherein the first tile group is a rectangular shape that wraps around the first picture in a horizontal direction and a vertical direction;
- determine a number of tiles in a second tile group partitioned from a second picture by:
  - setting a delta tile index as a difference between a last tile index of the second tile group and a first tile index of the second tile group;
  - determining a number of tile rows in the second tile group by dividing the delta tile index by a number of tile columns in the second picture plus one; and
  - determining a number of tile columns in the second tile group as the delta tile index modulo the number of tile columns in the second picture plus one; and
- decode the first tile group to generate a reconstructed video sequence for display.

16. The decoder of claim 15, wherein, prior to determining the number of tile rows in the second tile group and the number of tile columns in the second tile group, the delta tile index is increased by a number of tiles in the second picture and the number of tile columns in the second picture when the last tile index of the second tile group is less than the first tile index of the second tile group, indicating a vertical wrap, and a first tile column index is greater than a last tile column index, indicating a horizontal wrap.

17. The decoder of claim 15, wherein, prior to determining the number of tile rows in the second tile group and the number of tile columns in the second tile group, the delta tile index is increased by a number of tiles in the second picture when the last tile index of the second tile group is less than the first tile index, indicating a vertical wrap, and a first tile column index is not greater than a last tile column index, indicating no horizontal wrap.

18. The decoder of claim 15, wherein, prior to determining the number of tile rows in the second tile group and the number of tile columns in the second tile group, the delta tile index is increased by the number of tile columns in the second picture when the last tile index of the second tile group is not less than the first tile index, indicating no vertical wrap, and a first tile column index is greater than a last tile column index, indicating a horizontal wrap.

* * * * *

UNITED STATES PATENT AND TRADEMARK OFFICE
CERTIFICATE OF CORRECTION

| | |
|---|---|
| PATENT NO. | : 11,425,377 B2 |
| APPLICATION NO. | : 17/345870 |
| DATED | : August 23, 2022 |
| INVENTOR(S) | : FNU Hendry et al. |

It is certified that error appears in the above-identified patent and that said Letters Patent is hereby corrected as shown below:

On the Title Page

Item (72) Inventors: Delete "Hendry, San Diego, CA (US); Ye-Kui Wang, San Diego, CA (US)" and insert -- FNU Hendry, San Diego, CA (US); Ye-Kui Wang, San Diego, CA (US) --

Signed and Sealed this
Twenty-fifth Day of October, 2022

Katherine Kelly Vidal
*Director of the United States Patent and Trademark Office*